US006985215B2

(12) United States Patent
Oh et al.

(10) Patent No.: US 6,985,215 B2
(45) Date of Patent: Jan. 10, 2006

(54) PLASMA PROCESSING METHOD AND PLASMA PROCESSING APPARATUS

(75) Inventors: Hin Oh, Nirasaki (JP); Hideaki Sato, Nirasaki (JP); Naoki Takayama, Nirasaki (JP); Hisanori Sakai, Nirasaki (JP); Yuichi Mimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/055,612

(22) Filed: Feb. 11, 2005

(65) Prior Publication Data

US 2005/0146709 A1 Jul. 7, 2005

Related U.S. Application Data

(63) Continuation of application No. PCT/JP2003/10298, filed on Aug. 13, 2003.

(30) Foreign Application Priority Data

Aug. 13, 2002 (JP) ............................ 2002-235942
Aug. 13, 2002 (JP) ............................ 2002-235973

(51) Int. Cl.
*H01L 21/3065* (2006.01)
*G01J 3/28* (2006.01)
*G01J 3/30* (2006.01)

(52) U.S. Cl. .......................... 356/72; 356/326; 700/28; 156/324.24; 118/723 R

(58) Field of Classification Search .................. 356/72, 356/316, 326; 700/27, 29, 30, 31; 156/324.24; 118/723 R
See application file for complete search history.

(56) References Cited

U.S. PATENT DOCUMENTS 6,521,080 B2 * 2/2003 Balasubramhanya et al. ..................... 156/345.24
2002/0009814 A1 1/2002 Usui et al.

FOREIGN PATENT DOCUMENTS

JP 2002-25878 1/2002
JP 2002-202806 7/2002

* cited by examiner

*Primary Examiner*—F. L. Evans
(74) *Attorney, Agent, or Firm*—Oblon, Spivak, McClelland, Maier & Neustadt, P.C.

(57) ABSTRACT

In a plasma processing method and apparatus for monitoring information on a plasma processing, a multivariate analysis is performed by using as analysis data detection values detected for each object to be processed from a plurality of detection devices disposed in the processing apparatus upon the plasma processing. At that time, for each of sections defined whenever a maintenance of the processing apparatus is carried out, the detection values detected by the detection devices in the respective sections are compensated through a compensation unit, and the compensated detection values are taken as the analysis data.

34 Claims, 22 Drawing Sheets

NO COMPENSATION CASE

COMPENSATION CASE

PLASMA PROCESSING METHOD AND PLASMA PROCESSING APPARATUS

This application is a Continuation Application of PCT International Application No. PCT/JP2003/10298 filed on Aug. 13, 2003, which designated the United States.

FIELD OF THE INVENTION

The present invention relates to a plasma processing method and apparatus; and, more particularly, to a plasma processing method and apparatus for monitoring information on a plasma processing, for example, detection of an abnormality of the processing apparatus, and prediction of a status of the apparatus or an object to be processed such as a semiconductor wafer during the processing.

BACKGROUND OF THE INVENTION

In a semiconductor manufacturing process, various kinds of semiconductor manufacturing apparatuses or semiconductor inspection apparatuses have been used. For instance, a plasma processing apparatus performs, e.g., an etching process or a film forming process on an object to be processed by generating a plasma.

Such processing apparatuses include a plurality of parameters for controlling or monitoring operation states thereof, and perform various processes under an optimum condition by controlling or monitoring the parameters.

As parameters employed in, e.g., a plasma processing apparatus performing a film forming process or an etching process on an object to be processed such as a semiconductor wafer or a glass substrate, there are controllable parameters such as a flow rate of processing gas introduced in a processing chamber, a pressure in the processing chamber, a high frequency power applied to at least one of electrodes disposed, e.g., facing to each other in the processing chamber (hereinafter, referred to as control parameters).

Further, there are parameters such as optical data obtained through, e.g., plasma spectrum analysis for understanding a plasma state excited in the processing chamber, and electrical data, e.g., a high frequency voltage and current of a fundamental and harmonic wave based on the plasma (hereinafter, referred to as plasma reflection parameters).

Moreover, there are parameters such as capacity of a variable condenser under a matching condition of a matching unit provided for an impedance matching when a high frequency power is applied to the electrode in the processing chamber, and a high frequency voltage measured by a measurement area in the matching unit (hereinafter, referred to as apparatus status parameters).

When the plasma processing apparatus performs a process, the control parameters are set to optimum values, so that the plasma processing apparatus can be controlled to perform the optimum process by monitoring the plasma reflection parameters and the apparatus status parameters by detectors thereof all the time. However, since there are tens of kinds of such parameters, it is very difficult to exactly pinpoint the cause when an abnormality of the operation status is noticed.

Meanwhile, there has been proposed in, e.g., Japanese Patent Laid-open Publication No. H11-87323 a processing apparatus and a monitoring method thereof wherein a plurality of process parameters of a semiconductor wafer processing system are analyzed, and variations in process characteristics and system characteristics are detected by statistically correlating the parameters as data in an analysis.

Moreover, there is a method for estimating an operation status wherein the parameters are taken as analysis data and consolidated to a fewer number of statistical data by using a principal component analysis method which is one of multivariate analyses, so that the operation status of the processing apparatus is monitored based on the fewer number of statistical data.

In such conventional methods, a status abnormality of the plasma processing apparatus is detected by calculating indexes such as a sum of residual squares, a principal component score and a sum of principal component score squares from, e.g., a statistical analysis result such as the principal component analysis. Further, in case an abnormality is determined, the cause thereof is studied based on the indexes, and the status of the plasma processing apparatus can be ameliorated by, e.g., performing a wet cleaning if desired, or carrying out replacement of consumable parts or detection devices (sensors).

However, when the maintenance such as the wet cleaning described above is carried out, even when there is no real abnormality occurring in the plasma processing apparatus itself, a large error (hereinafter, referred to as a shift error) can be detected in the indexes such as the sum of residual squares (residual score), thereby decreasing the accuracy of the abnormality detection. One of the causes of the above phenomenon is speculated that trend of the status of the plasma processing apparatus is changed whenever the wet cleaning is carried out.

In case the trend of the status of the processing apparatus is changed due to the wet cleaning as described above, even when the status of the plasma processing apparatus is normal, there may develop a great variation in the indexes such as the sum of residual squares and the like. As a result, it is impossible to check whether or not the status of the plasma processing apparatus is abnormal. Therefore, there may occur a unique problem of the plasma processing apparatus wherein an accuracy of abnormality detection and an accuracy of prediction are decreased.

SUMMARY OF THE INVENTION

It is, therefore, an object of the present invention to provide a plasma processing method and apparatus capable of accurately performing a status prediction of the processing apparatus or a status prediction of an object to be processed and accurately monitoring information on the plasma processing all the time.

In accordance with a first aspect of the invention, there is provided a plasma processing method for monitoring information on a plasma processing in a processing apparatus which generate plasma in an air-tight processing chamber to plasma-process objects to be processed, the plasma processing method including: a data colleting step of collecting detection values detected for each of the objects from a plurality of detection devices disposed in the processing apparatus upon the plasma processing; a compensating step of compensating the detection values from the detection devices in respective sections that are defined whenever a maintenance of the processing apparatus is performed; and an analysis processing step of performing a multivariate analysis by using as analysis data the compensated detection values and monitoring information on the plasma processing based on the analysis results.

In accordance with a second aspect of the invention, there is provided a plasma processing apparatus for monitoring information on a plasma processing while generating plasma in an air-tight processing chamber to plasma-process objects to be processed, the plasma processing apparatus including: a data collection unit for collecting detection values detected for each of the objects from a plurality of detection devices disposed in the processing apparatus upon the plasma processing; a compensation unit for compensating the detection values from the detection devices in respective sections that are defined whenever a maintenance of the processing apparatus is performed; and an analysis processing unit for performing a multivariate analysis by using as analysis data the compensated detection values and monitoring information on the plasma processing based on the analysis results.

Further, in the compensation of the first and the second aspect of the present invention, it is preferable that the detection values in the respective sections are compensated by calculating an average of the detection values in a range among those in the respective sections and subtracting the average from the detection values in the respective sections.

Further, in the compensation of the first and the second aspect of the present invention, it is preferable that the detection values in the respective sections are compensated by calculating an average of the detection values in a range among those in the respective sections and dividing the detection values in the respective sections by the average.

Further, in the compensation of the first and the second aspect of the present invention, it is preferable that the detection values in the respective sections are compensated by calculating an average of all the detection values in the respective sections and subtracting the average from the detection values in the respective sections.

Further, in the compensation of the first and the second aspect of the present invention, it is preferable that the detection values in the respective sections are compensated in a way that an average and a standard deviation of the detection values in the respective sections are calculated and values obtained by subtracting the average from the detection values in the respective sections are divided by the standard deviation.

Further, in the compensation of the first and the second aspect of the present invention, it is preferable that the detection values in the respective sections are compensated in a way that an average and a standard deviation of the detection values in the respective sections are calculated, values obtained by subtracting the average from the detection values in the respective sections are divided by the standard deviation, and a loading compensation is performed for the resulted values.

Further, in the compensation of the first and the second aspect of the present invention, it is preferable that a principal component analysis is performed as the multivariate analysis to detect a status abnormality of the processing apparatus based on the result thereof.

Further, in the compensation of the first and the second aspect of the present invention, it is preferable that a multiple regression analysis is performed as the multivariate analysis to construct a model, and a status prediction of the processing apparatus or a status prediction of the objects is performed by using the model.

According to the first and the second aspect of the invention, for sections defined whenever a maintenance such as a cleaning in the apparatus and replacement of consumable parts or detection devices) is performed, a compensation processing is performed for detection values detected in each of the sections and a multivariate analysis is performed by using the compensated detection values as analysis data. Therefore, even when trend of the apparatus status is changed due to the maintenance operation and the detection values used in the multivariate analysis are changed, it is possible to prevent such changes from affecting the result of the multivariate analysis. As a result, accuracy of the status prediction of the apparatus or the status prediction of objects to be processed can be increased, and information on the plasma processing can be accurately monitored all the time.

In accordance with a third aspect of the invention, there is provided a plasma processing method for monitoring information on a plasma processing in a processing apparatus which generates plasma in an air-tight processing chamber to plasma-process objects to be processed, the plasma processing method including: a data colleting step of collecting detection values detected in a sequence of time for each of the objects from a plurality of detection devices disposed in the processing apparatus upon the plasma processing; a compensating step of sequentially compensating the detection values detected by the detection devices in a way that a current prediction value for the detection value detected by the detection devices is obtained by averaging a weighted last prediction value and a weighted current or last detection value, and a value obtained by subtracting the current prediction value from the current detection value is taken as a detection value after the compensation; and an analysis processing step of performing a multivariate analysis by using as analysis data the compensated detection values and monitoring information on the plasma processing based on the analysis results.

In accordance with a fourth aspect of the invention, there is provided a plasma processing apparatus for monitoring information on a plasma processing while generating plasma in an air-tight processing chamber to plasma-process objects to be processed, the plasma processing apparatus including: a data collection unit for collecting detection values detected in a sequence of time for each of the objects from a plurality of detection devices disposed in the processing apparatus upon the plasma processing; a compensation unit for sequentially compensating the detection values detected by the detection devices in a way that a current prediction value for the detection value detected by the detection devices is obtained by averaging a weighted last prediction value and a weighted current or last detection value, and a value obtained by subtracting the current prediction value from the current detection value is taken as the compensated detection value; and an analysis processing unit for performing a multivariate analysis by using as analysis data the compensated detection values and monitoring information on the plasma processing based on the analysis results.

Further, in the compensation of the third and the fourth aspect of the present invention, it is preferable that a model is constructed by performing a principal component analysis as the multivariate analysis by using data in a section among the compensated detection values as the analysis data; and it is determined on abnormality or normality of the status of the processing apparatus by using data in another section among the compensated detection values taken as the analysis data, based on the model. As such, the model is constructed in advance with the analysis data obtained by performing the aforementioned compensation processing for detection values of a predetermined number of wafers that have been collected in advance. Then, when objects are actually processed, with the analysis data obtained by performing the compensation processing on the detection values collected for each of the objects or a predetermined number of the objects (e.g., each lot), it is determined whether or not the status of the processing apparatus is abnormal based on the model for each object or the predetermined number of the objects (e.g., each lot) In this way, the determination on abnormality can be carried out in real time when the objects are plasma-processed actually.

Further, in the compensation of the third and the fourth aspect of the present invention, it is preferable that a model is constructed by dividing the analysis data into an explanatory variable and an objective variable and performing a partial least squares method as the multivariate analysis data by using data in a section among the divided analysis data; and data of the objective variable is predicted by using data of the explanatory variable in another section among the analysis data based on the model, wherein analysis data including the compensated detection values at the compensating step are used for the data of at least the explanatory variable between the explanatory variable and the objective variable .

According to the third and the fourth aspect of the invention, since the current detection values detected by the detection devices are compensated based on the detection values detected in advance, the compensation can be performed based on the trend of the detection values. By performing the multivariate analysis by using the compensated detection values as the analysis data, it is possible to prevent various variation of the detection values, for example, the trend of the detection values being greatly changed (shifted) due to maintenance such as a cleaning in the plasma processing apparatus and replacement of consumable parts and detection devices and the trend of the detection values being changed as time passes due to a long term operation of the plasma processing apparatus, from affecting the results of the multivariate analysis. As a result, detection accuracy of abnormality of the plasma processing apparatus and accuracy of status predictions of the plasma processing apparatus and objects to be processed can be increased. In this way, information on the plasma processing can be accurately monitored all the time, thereby preventing decrease in throughput and enhancing the productivity thereof.

In accordance with a fifth aspect of the invention, there is provided a plasma processing method for monitoring information on a plasma processing in a processing apparatus which generates plasma in an air-tight processing chamber to plasma-process objects to be processed, the plasma processing method including: a data colleting step of collecting detection values detected in a sequence of time for each of the objects from a plurality of detection devices disposed in the processing apparatus upon the plasma processing; a compensating step of sequentially compensating the detection values detected by the detection devices in a way that a value obtained by subtracting a current detection value detected by the detection devices from a last detection value is used as a compensated detection value; and an analysis processing step of performing a multivariate analysis by using as analysis data the compensated detection values and monitoring information on the plasma processing based on the analysis results.

In accordance with a sixth aspect of the invention, there is provided a plasma processing apparatus for monitoring information on a plasma processing while generating plasma in an air-tight processing chamber to plasma-process objects to be processed, the plasma processing apparatus including: a data collection unit for collecting detection values detected in a sequence of time for each of the objects from a plurality of detection devices disposed in the processing apparatus upon the plasma processing; a compensation unit for sequentially compensating detection values detected by the detection devices in a way that a value obtained by subtracting a current detection value detected by the detection devices from a last detection value is used as a compensated detection value; and an analysis processing unit for performing a multivariate analysis by using as analysis data the compensated detection values and monitoring information on the plasma processing based on the analysis results.

According to the fifth and the sixth aspect of the invention, since the multivariate analysis is performed by using as the compensated detection values those obtained by subtracting a last detection value from a current detection value detected by the detection devices, it is possible to prevent various variation of the detection values, for example, the trend of the detection values being greatly changed (shifted) due to maintenance such as a cleaning in the plasma processing apparatus and replacement of consumable parts and detection devices and the trend of the detection values being changed as time passes due to a long term operation of the plasma processing apparatus, from affecting the results of the multivariate analysis. As a result, detection accuracy of abnormality of the plasma processing apparatus and accuracy of status predictions of the plasma processing apparatus and objects to be processed can be increased. In this way, information on the plasma processing can be accurately monitored all the time, so that a decrease in throughput is prevented to enhance the productivity thereof. Further, with such a simple compensation wherein a value obtained by subtracting last detection value from current detection value detected by the detection devices is taken as the compensated detection value, it is possible to exhibit the above effects, so that the processing time can be shortened and the operation burden can be reduced.

Further, in the compensation of the third and the fourth aspect of the present invention, it is preferable that a model is constructed by performing a principal component analysis as the multivariate analysis by using as the analysis data the compensated detection values for a predetermined number of the objects to be processed; it is detected abnormality or normality of the status of the processing apparatus by the compensated detection values for other objects to be processed based on the model; an apparatus status correction processing of the processing apparatus is accelerated if abnormality is detected, and the plasma processing is again performed after the apparatus status correction processing has been completed. By this, since the processing apparatus is stopped at a time when abnormality occurs therein and the apparatus status correction processing such as a maintenance can be then performed, it possible to prevent the plasma processing from continuing under the abnormal state to compensate the detection values in sequence. In this way, it is possible to prevent influence of the detection values detected at a time when abnormality occurs in the compensation processing. Further, according to the aforementioned processing, the model is constructed in advance with the analysis data obtained by performing the aforementioned compensation processing for detection values of a predetermined number of the objects that have been collected in advance. Then, when objects are actually processed, with the analysis data obtained by performing the compensation processing on detection values collected for each of the objects or a predetermined number of the objects (e.g., each lot), it is determined whether or not the status of the processing apparatus is abnormal based on the model for each object or the predetermined number of the objects (e.g., each lot). In this way, the determination on abnormality can be carried out in real time when the objects are actually plasma-processed.

Furthermore, it is preferable that analysis data used in the model building unit are all data when the apparatus status is normal. With such configuration, since it is possible to construct the model with the normal data, accuracy of the abnormality detection based on the model can also be enhanced. Further, in the compensation of the third and the fourth aspect of the present invention, it is preferable that it is determined whether or not an obtained detection value is one after the apparatus status correction processing, and there is performed a compensation wherein a value obtained by subtracting a current detection value from a last detection value is taken as the compensated detection value if it is determined that the obtained detection value is not one after the apparatus status correction processing, while the model is reconstructed by the model building unit if it is determined that the obtained detection value is one after the apparatus status correction processing. In this way, it is possible to prevent influence of the detection values at that time when an abnormality occurs in the compensation.

Further, in the compensation of the third and the fourth aspect of the present invention, it is preferable that it is determined whether or not an obtained detection value is one after the apparatus status correction processing, and there is performed a compensation wherein a value obtained by subtracting a current detection value from a last detection value is taken as the compensated detection value if it is determined that the obtained detection value is not one after the apparatus status correction processing, while there is performed a compensation wherein a detection value at a time when the apparatus status is normal before the apparatus status correction processing is taken as a last detection value and a value obtained by subtracting a current detection value from said last detection value if it is determined that the obtained detection value is one after the apparatus status correction processing. In this way, it is also possible to prevent influence of the detection values at that time when an abnormality occurs in the compensation.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
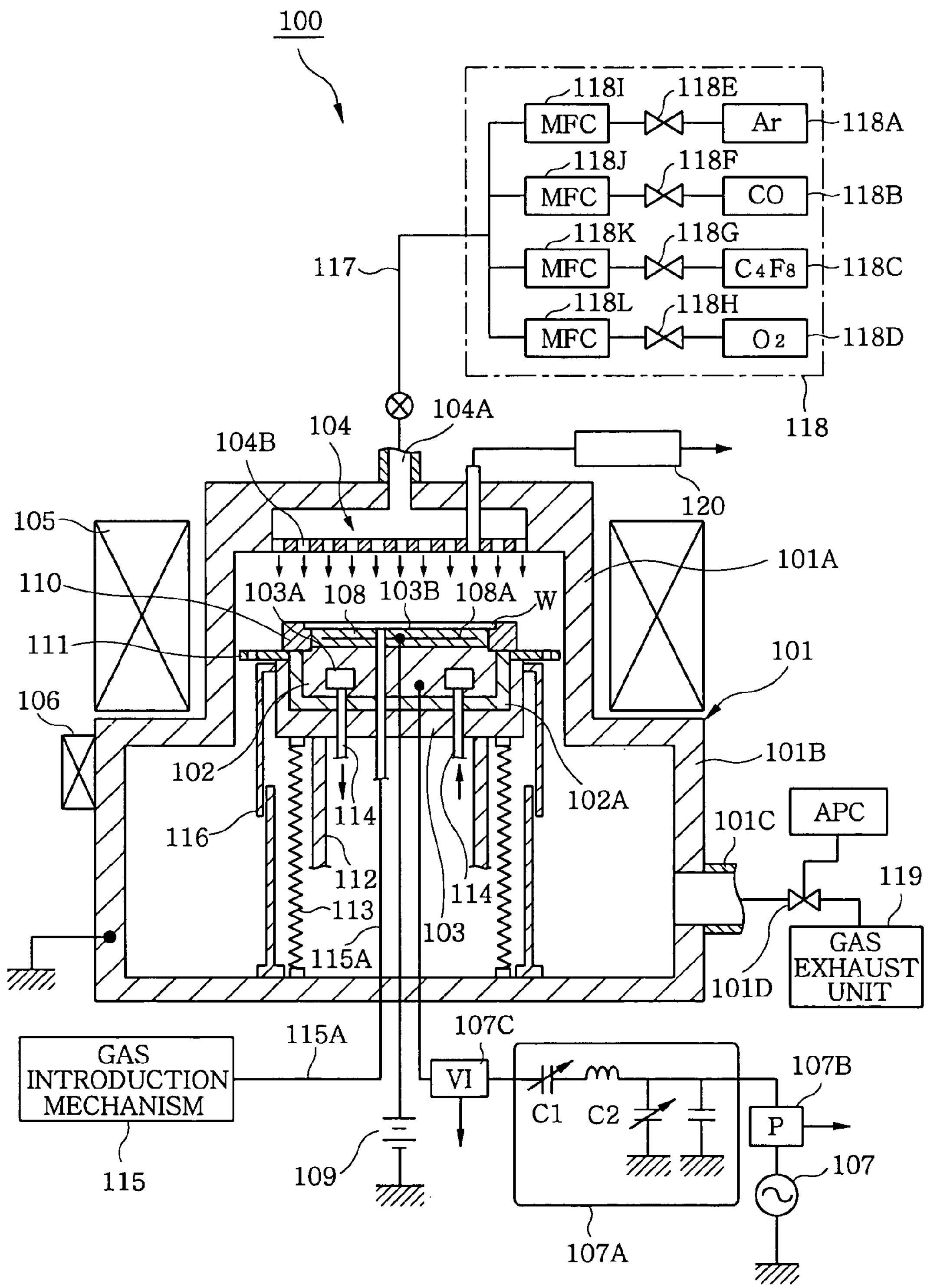
FIG. 1 shows a schematic diagram of a plasma processing apparatus in accordance with a preferred embodiment of the present invention.

Hereinafter, a plasma processing apparatus and method in accordance with preferred embodiments of the present invention will be described in detail with reference to the accompanying drawings. Further, in this specification and the accompanying drawings, like reference numerals will be given to like parts having substantially same functions, and redundant description thereof will be omitted.

(First Preferred Embodiment)

(Configuration of a Plasma Processing Apparatus)

FIG. 1 shows a schematic diagram of a plasma processing apparatus in accordance with a first preferred embodiment of the present invention. The plasma processing apparatus 100 includes a processing chamber 101 made of, e.g., aluminum; a vertically movable support 103 made of, e.g., aluminum, for supporting a lower electrode 102 installed in the processing chamber 101 via an insulating material 102A; and a shower head (upper electrode) 104 installed above the support 103, for supplying a process gas and serving as an upper electrode.

The processing chamber 101 has an upper room 101A of a smaller diameter and a lower room 101B of a larger diameter. The upper room 101A is surrounded by a dipole ring magnet 105. The dipole ring magnet 105 is formed by accommodating a plurality of columnar anisotropic segment magnets in a ring-shaped casing made of a magnetic substance and generates a horizontal magnetic field directed in one direction in the upper room 101A as a whole.

An opening for loading and unloading a wafer W into and from the processing chamber 101 is provided at an upper portion of the lower room 101B, and a gate valve 106 is installed thereat. Further, the lower electrode 102 is connected to a high frequency power supply 107 via a matching unit 107A. A high frequency power P of 13.56 MHz is applied from the high frequency power supply 107 to the lower electrode 102, thereby forming a vertical electric field between the upper electrode 104 and the lower electrode 102 in the upper room 101A. The high frequency power P is detected by a power meter 107B connected between the high frequency power supply 107 and the matching unit 107A. The high frequency power P is a controllable parameter, and the high frequency power P and other controllable parameters such as a flow rate of gas and a pressure in the processing chamber 101 which will be described later, are defined as control parameters in this embodiment.

Moreover, an electrical measurement equipment (e.g., a VI probe) 107C is provided on the lower electrode 102 side (a high frequency voltage output side) of the matching unit 107A. A high frequency voltage V and a high frequency current I of fundamental and harmonic wave are detected through the electrical measurement equipment 107C as electrical data originated from a plasma generated in the upper room 101A by the high frequency power P applied to the lower electrode 102.

Furthermore, the matching unit 107A incorporates therein, e.g., two variable capacitors C1 and C2, a capacitor C, and a coil L, and performs impedance matching via the variable capacitors C1 and C2. Capacities of the variable capacitors C1, C2 and a high frequency voltage Vpp measured by a measuring device (not shown) in the matching circuit unit 107A together with an opening degree of an APC (Automatic Pressure Controller) to be described later are parameters indicating a status of the processing apparatus which is operating. In this embodiment, the capacities of the variable capacitors C1, C2, the high frequency voltage Vpp and the opening degree of an APC (Automatic Pressure Controller) are defined as apparatus status parameters.

An electrostatic chuck 108 is disposed on a top surface of the lower electrode 102, and an electrode plate 108A of the electrostatic chuck 108 is connected to a DC power supply 109. Therefore, by applying a high voltage from the DC power supply 109 to the electrode plate 108A under a high vacuum state, the electrostatic chuck 108 electrostatically suctions a wafer W.

A focus ring 110 positioned around a periphery of the lower electrode 102 serves to focus the plasma generated in the upper room 101A on the wafer W. Further, an exhaust ring 111 installed on top of the support 103 is provided under the focus ring 110. The exhaust ring 111 has a plurality of holes spaced apart from each other at regular intervals in a circumferential direction thereof, and gases in the upper room 101A are discharged to the lower room 101B through the holes.

The support 103 is vertically movable between the upper room 101A and the lower room 101B through a ball screw mechanism 112 and a bellows 113. Thus, in case the wafer W is to be placed on the lower electrode 102, the lower electrode 102 is lowered into the lower room 101B by the support 103 and the gate valve 106 is opened so that the wafer W can be placed on the lower electrode 102 through a transfer mechanism (not shown). An electrode distance between the lower electrode 102 and the upper electrode 104 is a parameter that can be set to a desired value, and is defined as one of the control parameters as described above.

Further, the support 103 has therein a coolant path 103A connected to a coolant line 114. By circulating coolant within the coolant path 103A through the coolant line 114, the wafer W is controlled to be maintained at a predetermined temperature. In addition, a gas path 103B is formed through the support 103, the insulating material 102A, the lower electrode 102, and the electrostatic chuck 108. Therefore, e.g., a He gas serving as a backside gas can be supplied under a predetermined pressure from a gas introduction mechanism 115 to a fine gap formed between the electrostatic chuck 108 and the wafer W through a gas line 115A. Accordingly, thermal conductivity between the electrostatic chuck 108 and the wafer W can be increased through the He gas. A reference numeral 116 indicates a bellows cover.

Provided in a top wall of the shower head 104 is a gas introduction portion 104A connected to a process gas supply system 118 through a line 117. The process gas supply system 118 includes an Ar gas source 118A, a CO gas source 118B, a $C_4F_8$ gas source 118C, and an $O_2$ gas source 118D. Such gas sources 118A to 118D supply corresponding gases at predetermined flow rates to the shower head 104 through valves 118E, 118F, 118G, and 118H and mass flow controllers 118I, 118J, 118K, and 118L, respectively. Then, the supplied gases are mixed together in the shower head 104 to form a gaseous mixture of a predetermined mixing ratio. The flow rates of the gases can be detected by the mass flow controllers 118I, 118J, 118K, and 118L, respectively, and are defined as the control parameters as described above.

A plurality of holes 104B are regularly distributed in a bottom wall of the shower head 104. The gaseous mixture is supplied as a process gas from the shower head 104 into the upper room 101A through the holes 104B. Further, a gas exhaust pipe 101C is connected to an exhaust hole formed at a lower portion of the lower room 101B. By evacuating the processing chamber 101 through a gas exhaust unit 119 implemented by, e.g., a vacuum pump connected to the gas exhaust pipe 101C, a predetermined gas pressure can be maintained in the processing chamber 101. The gas exhaust pipe 101C is provided with an APC valve 101D, and an opening degree of the APC valve 101D is automatically regulated depending on the gas pressure in the processing chamber 101. The opening degree is an apparatus status parameter indicating the state of the processing apparatus and cannot be controlled.

Moreover, installed at, e.g., the shower head 104 is a spectrometer 120 (hereinafter, referred to as an 'optical measurement device') for detecting plasma emission generated in the processing chamber 101. Based on optical data regarding a specific wavelength obtained by the optical measurement device 120, namely, a plasma state is monitored to detect an end point of the plasma process. The optical data, together with the electrical data originated from a plasma generated by the high frequency power P, make up plasma reflection parameters reflecting the plasma state.

(Multivariate Analysis Unit)

Figure 2:
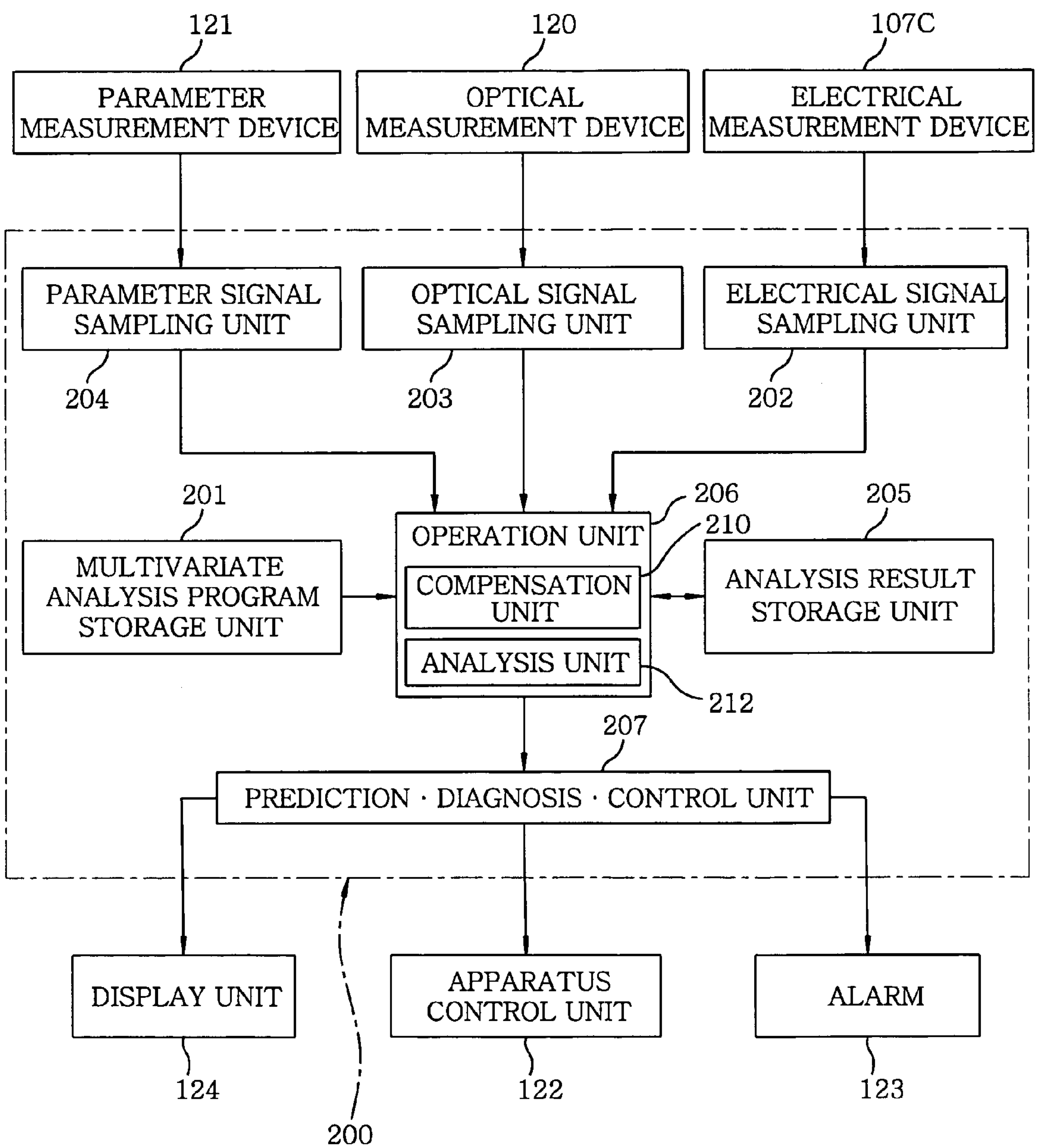
FIG. 2 illustrates a block diagram of an exemplary multivariate analysis unit in the preferred embodiment.

Hereinafter, a multivariate analysis unit incorporated in the plasma processing apparatus 100 in accordance with this preferred embodiment will be described with reference to the accompanying drawings. As illustrated in FIG. 2, a multivariate analysis unit 200 includes a multivariate analysis program storing unit 202 for storing multivariate programs such as a principal component analysis ("PCA") or a partial least squares ("PLS") method, and an electrical, an optical and a parameter signal sampling unit 202, 203 and 204 for intermittently sampling signals from the electrical measurement device 107C, the optical measurement device 120 and a parameter measurement device 121, respectively. The data sampled by the respective sampling units 202, 203, 204 become detection values from the respective detecting units.

Further, the parameter measurement device 121 is a measurement device for measuring the aforementioned control parameters. When the multivariate analysis is carried out, it is not necessary to use all of the data, so that the multivariate analysis is performed with at least one kind of data from the electrical measurement device 107C, the optical measurement device 120 and the parameter measurement device 121. Accordingly, the data from all of the measurement devices may be used, or the data from only the electrical measurement device 107C or the optical measurement device 120 may be used.

The plasma processing apparatus includes an analysis result storage unit 205 for storing results of the multivariate analysis such as a model made by the multivariate analysis; an operation unit 206 for detecting (diagnosing) abnormal values of specified parameters or calculating prediction values based on the analysis results; and a prediction· diagnosis· control unit 207 for predicting, diagnosing and controlling the control parameters and/or apparatus state parameters based on operation results of the operation unit 206.

Connected to the multivariate analysis unit 200 are a control device 122 for controlling the plasma processing apparatus, an alarm 123 and a display unit 124. The control device 122, for example, continues or interrupts the processing of the wafer W based on signals from the prediction· diagnosis· control unit 207. The alarm 123 and the display unit 124 report any abnormalities of the control parameters and/or apparatus state parameters based on signals from the prediction· diagnosis· control unit 207 as will be described later.

The operation unit 206 includes a compensation unit 210 for compensating detection values detected from the respective detection devices forming the respective parameters, and an analysis unit 212 for performing the multivariate analysis by using as analysis data compensation values compensated by the compensation unit 210.

In the first preferred embodiment, the analysis unit 212 performs, e.g., a principal component analysis as the multivariate analysis. An etching process is performed in advance on sample wafers in an initial range up to an initial wet cleaning, which become a standard, and at this time detection values detected by the respective detection devices, i.e., a high frequency voltage Vpp, an output of the optical measurement device 120 and the like are detected one by one as the analysis data for each of the wafers. For example, if K detection values x exist for each of N wafers, a matrix including the analysis data is expressed as Eq. 1.

$$X = \begin{bmatrix} x_{11} & x_{12} & \cdots & x_{1K} \\ x_{21} & x_{22} & \cdots & x_{2K} \\ \vdots & \vdots & \vdots & \vdots \\ x_{N1} & x_{N2} & \cdots & x_{NK} \end{bmatrix} \quad \text{Eq. 1}$$

Further, in the operation unit 206, the average, the maximum value, the minimum value and the variance for each of the detection values are calculated. Thereafter, with use of a variance-covariance matrix based on the calculated values, a principal component analysis on multiple analysis data is performed, to obtain eigenvalues and eigenvectors thereof.

The eigenvalue indicates the magnitude of the variance of respective analysis data. Then, the first principal component, the second principal component, . . . and the nth principal component are defined in the decreasing order of the eigenvalue. Further, each of the eigenvalues has an eigenvector associated thereto. In general, as the degree of the principal component increases, a contribution rate for an evaluation of data becomes lower, and the usefulness decreases.

For example, if K detection values are adopted for each of N wafers, the $a^{th}$ principal component score corresponding to the $a^{th}$ eigenvalue for the $n^{th}$ wafer is expressed as Eq. 2.

$$t_{na}=X_{n1}P_{1a}+X_{n2}P_{2a}+\ldots+X_{nK}P_{Ka} \quad \text{Eq. 2}$$

The vector $t_a$ and the matrix $T_a$ for the $a^{th}$ principal component score are defined by Eq. 3, and the eigenvector $p_a$ and the matrix $P_a$ for the $a^{th}$ principal component score are defined by Eq. 4. Further, the vector $t_a$ of the $a^{th}$ principal component score are expressed as Eq. 5 by using the matrix X and the eigenvector $p_a$. In addition, with use of the vectors $t_1$ to $t_K$ of the principal component score and the eigenvectors $p_1$ to $p_K$ thereof, the matrix X is represented as Eq. 6. In Eq. 6, $P_K^T$ is a transposed matrix for $P_K$.

$$t_a = \begin{bmatrix} t_{1a} \\ t_{2a} \\ \vdots \\ t_{Na} \end{bmatrix}, \quad X = \begin{bmatrix} x_{11} & x_{12} & \cdots & x_{1K} \\ x_{21} & x_{22} & \cdots & x_{2K} \\ \vdots & \vdots & \vdots & \vdots \\ x_{N1} & x_{N2} & \cdots & x_{NK} \end{bmatrix} \quad \text{Eq. 3}$$

$$P_a = \begin{bmatrix} P_{a1} \\ P_{a2} \\ \vdots \\ P_{aN} \end{bmatrix} \quad \text{Eq. 4}$$

$$t_a = Xp_a \quad \text{Eq. 5}$$

$$X = T_K P_K^T = t_1 p_1^T + t_2 p_2^T + \ldots + t_K p_K^T, \quad \text{Eq. 6}$$

Furthermore, a residual matrix (components in each row correspond to the detection values by the respective detection devices and components in each column correspond to the number of wafers) is constructed by merging the $(a+1)^{st}$ or more high-degree principal components whose contribution rates are low. Then, by applying the residual matrix X to Eq. 6, Eq. 6 is expressed as Eq. 8. With use of a row vector $e_n$ defined in Eq. 9, the residual score $Q_n$ of the residual matrix E is expressed as Eq. 10. In Eq. 10, the residual score $Q_n$ indicates the $n^{th}$ wafer.

$$E = t_{a+1} P_{a+1}^T + \ldots + t_K P_K^T = \begin{bmatrix} e_{11} & e_{12} & \cdots & e_{1n} \\ e_{21} & e_{22} & \cdots & e_{2n} \\ \vdots & \vdots & \vdots & \vdots \\ e_{N1} & e_{N2} & \cdots & e_{NK} \end{bmatrix} \quad \text{Eq. 7}$$

$$X = t_a P_a^T + E = t_1 P_1^T + t_2 P_2^T + \ldots + t_a P_a^T + E \quad \text{Eq. 8}$$

$$e_n = [e_{n1} \; e_{n2} \; \cdots \; e_{nK}] \quad \text{Eq. 9}$$

$$Q_n = e_n e_n^T \quad \text{Eq. 10}$$

The residual score $Q_n$ is an index indicating residuals (errors) among respective detection values for the $n^{th}$ wafer and is defined by Eq. 10. The residual score $Q_n$ is expressed by a product of the row vector $e_n$ and the vector $e_n^T$ that is a transposed matrix thereof, and becomes a sum of squares of respective residuals. As a result, a reliable residual can be obtained without offsetting plus components and minus components thereof.

In this preferred embodiment, by calculating the residual score Q, operation status of the processing apparatus is monitored and evaluated through various methods.

Specifically, in case the residual score $Q_n$ of a certain wafer is deviated from the residual score $Q_0$ of the sample wafer, if components of the row vector $e_n$ are monitored, it is determined which detection value of the wafer in question has a great deviation upon the processing of the wafer, so that it is possible to pinpoint a cause of the abnormality.

Moreover, in the row (same wafer) of the residual matrix E, by monitoring analysis data of each of the detection devices where the residual score thereof has been deviated, it can be accurately determined that which detection value is abnormal for the very wafer.

(Concrete Sequence of Abnormality Detection in the First Preferred Embodiment)

Hereinafter, with reference to FIG. 2, there will be described a concrete sequence of, e.g., detecting abnormality of the processing apparatus by actually performing the multivariate analysis. At the first stage, a model is built by the multivariate analysis based on the data of sections defined whenever the wet cleaning is performed. Specifically, in a model building section, the data from the parameter measurement device 121, the optical measurement device 120 and the electrical measurement device 107C are subject to compensation by the compensation unit 210, which will be described later. Next, a specified program is read out from a multivariate analysis program unit 201, and the multivariate analysis is performed by the analysis unit 210 to construct a model. The constructed model is stored in an analysis result storage unit 205.

At the second stage, for example, abnormality detection of the processing apparatus is performed. For all the sections, the data from the parameter measurement device 121, the optical measurement device 120 and the electrical measurement device 107C are compensated by the compensation unit 210 as similarly to the first stage. Then, the model is read out from the analysis result storage unit 205, and the operation unit 206 operates it to obtain the residual score Q. The prediction· diagnosis· control unit 207 detects abnormality of the processing apparatus based on the residual score Q obtained. For example, it is determined "normal" if the residual score Q falls within a predetermined constant range (e.g., a range of an average plus a value 3 times a standard deviation), and "abnormal" if otherwise.

(Compensation Method by the First Embodiment)

Hereinafter, specific examples of a compensation method by the compensation unit 210 will be described with reference to the drawings. For every section defined whenever the maintenance of the plasma processing apparatus 100 is performed, the compensation unit 210 of the first preferred embodiment compensates detection values detected from the respective detection devices in each section. The status of the plasma processing apparatus can be changed due to operation of the apparatus and a change (improvement) in the apparatus status through, e.g., a maintenance. For example, changing (improving) the apparatus status includes, e.g., performing a wet cleaning for improving the processing environment or processing prediction environment in the apparatus and replacing consumable parts or detection devices (sensors). Further, in a compensation method, in case the wet cleaning is performed as the maintenance, for every section (wet cleaning cycle) defined whenever the wet cleaning is performed, detection values in each section are compensated for each parameter by using detection values in some of the sections.

(First Compensation Method by the First Embodiment)

A concrete compensation method in accordance with the first preferred embodiment will be described below.

By referring to sections defined whenever the wet cleaning is performed as wet cleaning cycles (hereinafter, referred as also "cycles" for the simplification) WC, for detection values in a range among detection values detected by the respective detection devices in the sections of cycles WC, an average is calculated for each parameter, and based on the average, the respective detection values in the section are compensated for each parameter. Such compensation is performed for each cycle WC. For instance, in case wafers of each lot, including 25 wafers, are plasma-processed, it uses an average of detection values obtained by the plasma processing performed for a lot (initial lot) immediately after the wet cleaning is carried out.

First, an average of detection values in a range among detection values in a section of cycle WC to be compensated is calculated for each parameter. In the matrix X expressed by the aforementioned Eq. 1, detection values $x_k$ of parameter k can be represented by Eq. 11. If an average $x_k'$ for the detection values for wafers, e.g., from the $p^{th}$ to the $q^{th}$ wafer, among the detection values $x_k$, $x_{k'}$ can be expressed by Eq. 12. In case an average of 25 wafers of the initial lot is calculated in the section of each cycle WC, p and 1 are set to be 1 and 25 in Eq. 12, respectively.

$$x_k = \begin{bmatrix} x_{1k} \\ x_{2k} \\ \vdots \\ x_{Nk} \end{bmatrix} (k = 1, 2, \ldots, K) \quad \text{Eq. 11}$$

$$x_k' = \frac{\sum_{n=p}^{q} x_{nk}}{q - p + 1} \quad \text{Eq. 12}$$

Next, by subtracting the average $x_k'$ from the respective detection values in the section of cycle WC for each parameter, all of the detection values in the cycle WC are compensated. Detection values $X_{SUB}$ after the compensation by the average $x_k'$ for each parameter k are expressed as Eq. 13 by using X of Eq. 1.

$$X_{SUB} = X - \begin{bmatrix} x_1' & x_2' & \cdots & x_K' \\ x_1' & x_2' & \cdots & x_K' \\ \vdots & \vdots & \vdots & \vdots \\ x_1' & x_2' & \cdots & x_K' \end{bmatrix} \quad \text{Eq. 13}$$

(Second Compensation Method by the First Embodiment)

Further, in lieu of subtracting $x_k'$ as described above, all of the detection values in the cycle WC may be compensated by dividing the respective detection values in the above section by the above average. Detection values $X_{DIV}$ after the compensation by the average $x_k'$ for each parameter k are expressed as Eq. 14 by using X of Eq. 1. In Eq. 14, the matrix on the right side is a diagonal matrix.

$$X_{DIV} = X \begin{bmatrix} x_1'^{-1} & 0 & \cdots & 0 \\ 0 & x_2'^{-1} & \cdots & \vdots \\ \vdots & \vdots & \cdots & 0 \\ 0 & \cdots & 0 & x_n'^{-1} \end{bmatrix} \quad \text{Eq. 14}$$

There will now be reviewed a result of an experiment wherein a principal component analysis was performed by using data compensated through the above-described compensation method in the compensation unit 210. The principal component analysis was carried out based on detection values from the detection devices for each wafer in case of an etching process performed on a silicon film on the wafer as the plasma processing. As the etching conditions, the high frequency power applied to a lower electrode was 4000 W and its frequency was 13.56 MHz. Further, the pressure in the processing chamber was 50 mTorr, and as the processing gas, a gaseous mixture of $C_4F_8$ of 20 sccm, $O_2$ of 10 sccm, CO of 100 sccm, and Ar of 440 sccm was used.

Figure 3:
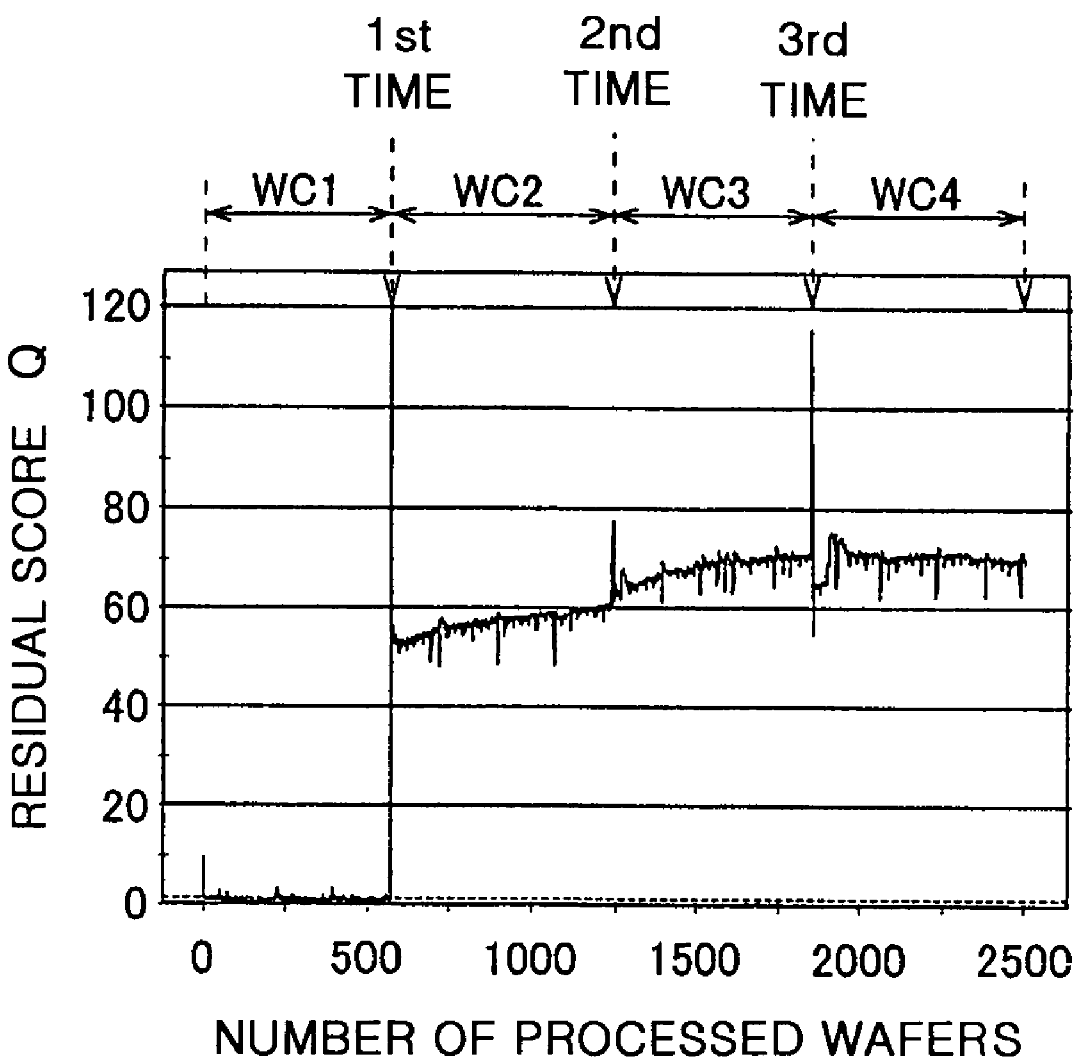
FIG. 3 provides a graph showing residual scores Q in a case where a principal component analysis is performed by using detection values subject to no compensation and a model is created by the detection values in a cycle WC1.
Figure 4:
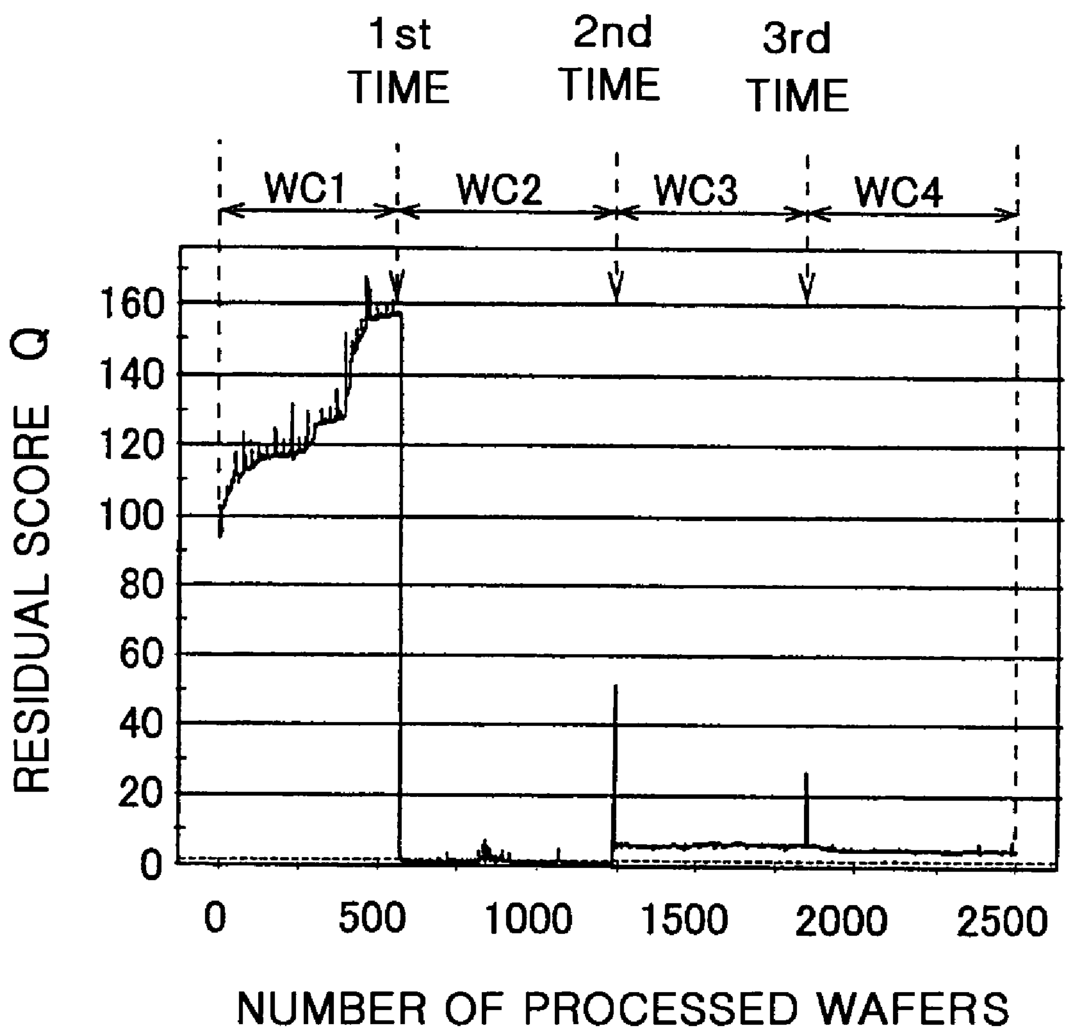
FIG. 4 presents a graph showing residual scores Q in a case where a principal component analysis is performed by using detection values subject to no compensation and a model is created by the detection values in a cycle WC2.

First, results of the residual score (sum of residual square) Q obtained by performing the principal component analysis by using detection values subject to no compensation are shown in FIGS. 3 and 4 for the comparison with a case where the respective detection values are compensated by the compensation unit 210. Here, as the detection values, detection values detected by the respective detection devices whenever the wafers are etched under the aforementioned conditions are used as the analysis data. Further, in FIGS. 3 and 4, dotted arrows indicate points of time when the wet cleaning was performed, and the vertical axis and the horizontal axis represent the residual score Q and the number of processed wafers, respectively. (These are also applied to FIGS. 5 to 12.) In FIGS. 3 and 4, a section from an initial wafer data to a point of time when the first wet cleaning was performed is set as cycle WC1, a section from a point of time after the first wet cleaning to a point of time when the second wet cleaning was performed is set as cycle WC2, a section from a point of time after the second wet cleaning to a point of time when the third wet cleaning was performed is set as cycle WC3, and a section from a point of time after the third wet cleaning to a final wafer data is set as cycle WC4.

Herein, the sum of residual square Q indicates a residual (error) with detection values (actual measurement values) for each parameter. In the graph in FIG. 3, it is determined "normal" if the sum of residual square Q falls within a predetermined constant range (e.g., a range of the sum of an average and a value 3 times a standard deviation), and "abnormal" if otherwise. The more the sum of residual square Q is deviated from the range, the greater the error becomes.

FIG. 3 is a graph indicating results of the residual scores obtained for the detection values of all of the cycles WC1 to WC4 based on a model which is constructed by obtaining an eigenvalue and an eigenvector by performing a principal component analysis with the analysis unit 212 by using the detection values of the cycle WC1. FIG. 4 is a graph indicating results of the residual scores obtained for the detection values of all of the cycles WC1 to WC4 based on a model which is built by obtaining an eigenvalue and an eigenvector by performing a principal component analysis with the analysis unit 212 by using the detection values of the cycle WC2.

As can be seen from FIGS. 3 and 4, the residual scores Q are significantly different between before and after each wet cleaning, thereby implying that the deviation thereof has occurred. It is considered that the trend change (shift error) of the apparatus status (trend of the respective detection values) due to performing the wet cleaning is one of the causes. Further, at the cycle WC1 (or WC2) in FIG. 3 (or FIG. 4), the residual scores Q fall within the tolerance range (e.g., under the dotted line) where the apparatus status is determined as normal. This is because the principal component analysis has been performed by using the detection values of the cycle WC1. In addition, in FIGS. 3 to 8, the dotted line is a value of the sum of an average of the residual scores Q and a value 3 times a standard deviation.

As described above, since there occurs the shift error to the residual scores Q between before and after the wet cleaning in any case of FIGS. 3 and 4, it is understood that the great deviation occurred between before and after the wet cleaning cannot be eliminated even though the principal component analysis by using the detection values of any of the cycles WC1 and WC2. That is, the great deviation occurred between before and after the wet cleaning cannot be eliminated by way of merely building and correcting a model by performing the principal component analysis for each cycle WC.

Next, with reference to FIGS. 5 and 6, there will be described results of an experiment wherein compensation was carried out by subtracting an average of detection values in a range of each cycle WC. Herein, the compensation was carried out by subtracting an average of detection values for wafers (e.g., 25 wafers) of an initial lot of each cycle WC for each parameter from the detection values for the respective cycles WC.

Figure 5:
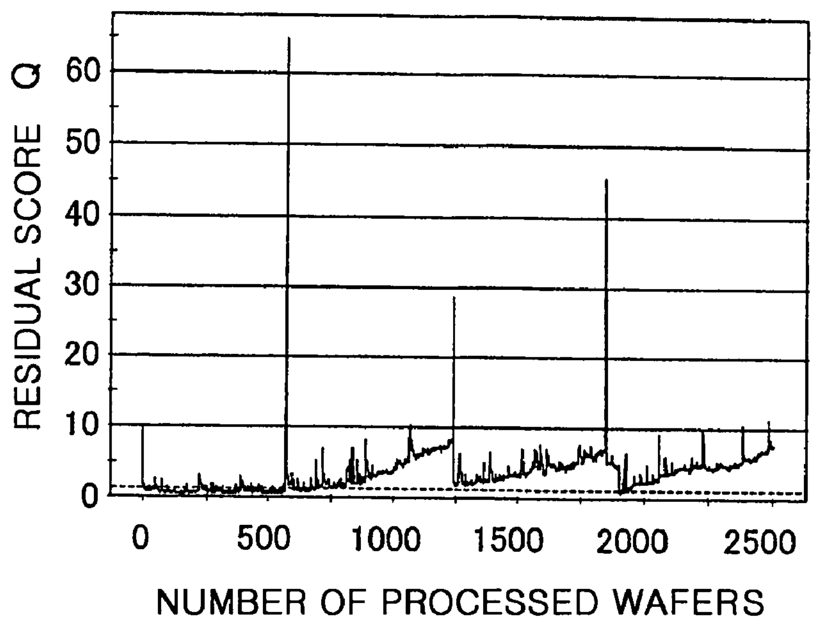
FIG. 5 represents a graph showing residual scores Q in a case where a compensation is performed by subtracting an average of detection values in a range and a model is created by using the detection values in the cycle WC1 after the compensation.

FIG. 5 is a graph indicating results of the residual scores obtained for the compensated detection values of all of the cycles WC1 to WC4 based on a model which is constructed by performing a principal component analysis by using the compensated detection values of the cycle WC1 to obtain an eigenvalue and an eigenvector. FIG. 6 is a graph indicating results of the residual scores obtained for the compensated detection values of all of the cycles WC1 to WC4 based on a model which is made by performing a principal component analysis by using the compensated detection values of the cycle WC2 to obtain an eigenvalue and an eigenvector.

Figure 6:
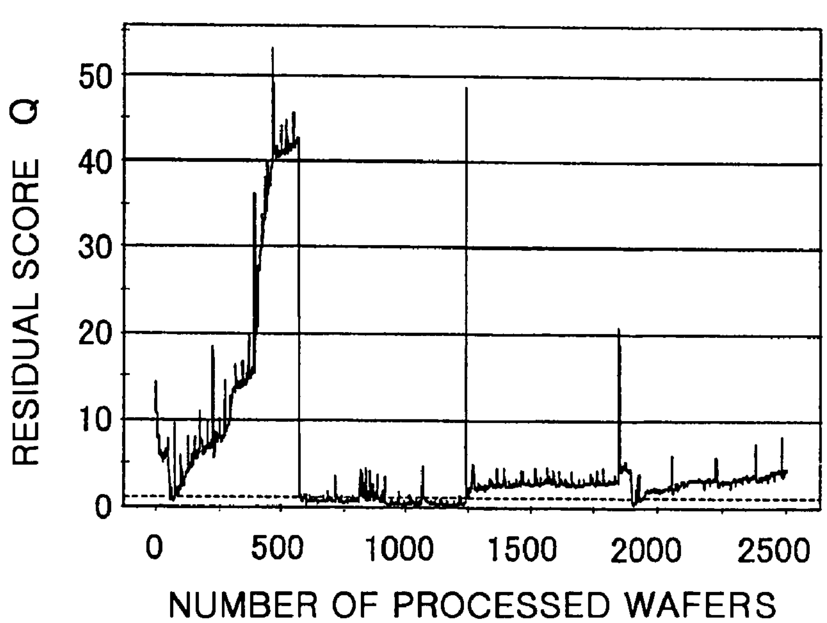
FIG. 6 depicts a graph showing residual scores Q in a case where a compensation is performed by subtracting an average of detection values in a range and a model is created by using the detection values in the cycle WC2 after the compensation.

In both cases of FIGS. 5 and 6, there is no significant difference in the residual scores Q between before and after each wet cleaning. Accordingly, the great change (shift error) in the residual scores Q from before to after each wet cleaning, which occurred in FIGS. 3 and 4, is eliminated. As such, by performing the compensation through subtracting the average of the detection values in a range for each cycle WC in the compensation unit 210, it is possible to eliminate the shift error occurring in an index such as the residual score Q due to the change in trend of the detection values caused by, e.g., a maintenance work such as cleaning in the plasma processing apparatus and replacement of consumable parts or the detection devices. In this way, the analysis accuracy of the principal component analysis can be enhanced and information on the plasma processing can be accurately monitored all the time.

Subsequently, with reference to FIGS. 7 and 8, there will be described results of an experiment wherein compensation was carried out by dividing with an average of detection values in a range of each cycle WC. Herein, the compensation was carried out by dividing detection values for the respective cycles WC by an average of detection values for wafers (e.g., 25 wafers) of an initial lot of each cycle WC for each parameter.

Figure 7:
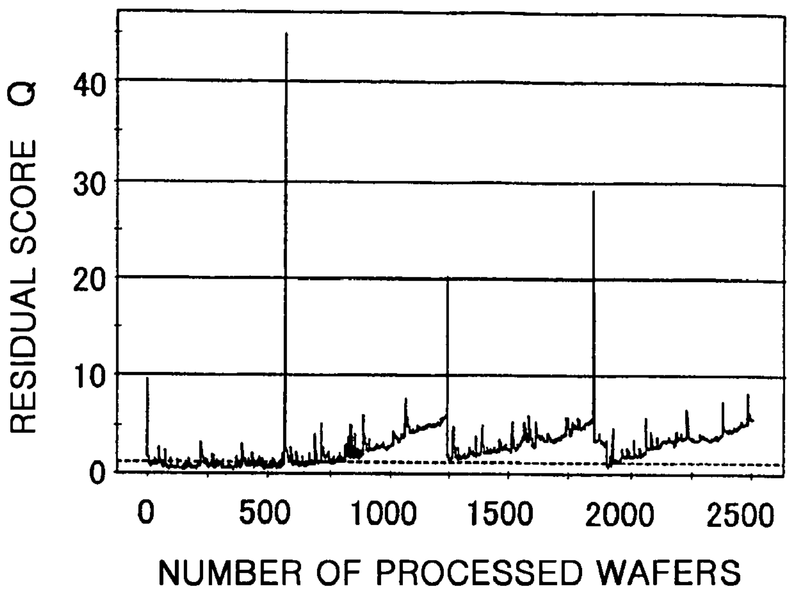
FIG. 7 describes a graph showing residual scores Q in a case where a compensation is performed by dividing with an average of detection values in a range and a model is created by using the detection values in the cycle WC1 after the compensation.

FIG. 7 is a graph indicating results of the residual scores obtained for the compensated detection values of all of the cycles WC1 to WC4 based on a model which is constructed by performing a principal component analysis by using the compensated detection values of the cycle WC1 to obtain an eigenvalue and an eigenvector. FIG. 8 is a graph indicating results of the residual scores obtained for the compensated detection values of all of the cycles WC1 to WC4 based on a model which is built by performing a principal component analysis by using the compensated detection values of the cycle WC2 to obtain an eigenvalue and an eigenvector.

Figure 8:
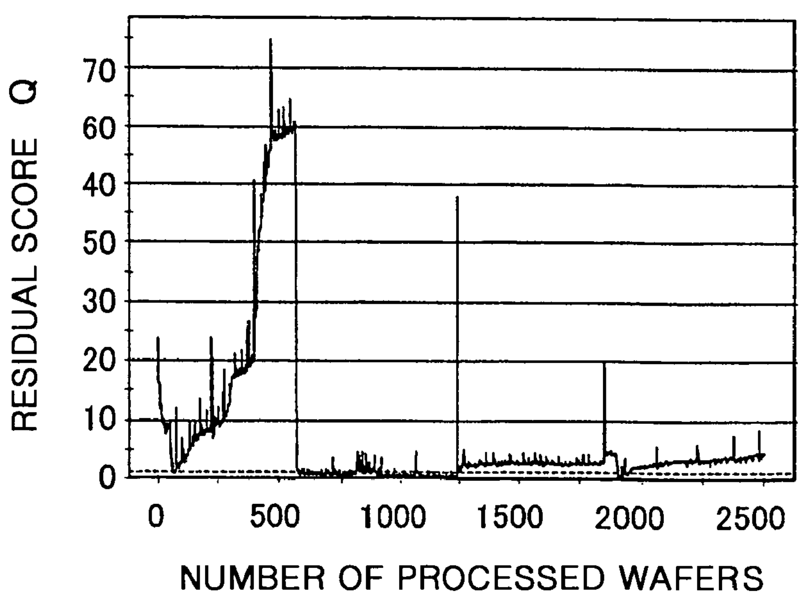
FIG. 8 offers a graph showing residual scores Q in a case where a compensation is performed by dividing with an average of detection values in a range and a model is created by using the detection values in the cycle WC2 after the compensation.

Also, in both cases of FIGS. 7 and 8, the significant change (shift error) in the residual scores Q from before to after each wet cleaning, which occurred in FIGS. 3 and 4, is eliminated. As such, by performing the compensation through dividing with the average of the detection values in a range for each cycle WC in the compensation unit 210, it is also possible to eliminate the deviation in trend of the apparatus status due to the wet cleaning and to thereby enhance an analysis accuracy of the principal component analysis.

(Third Compensation Method by the First Embodiment)

Hereinafter, there will be described another compensation method through the aforementioned compensation unit 210 with reference to the drawings. Although, in the above-described compensation methods, an average is calculated for each parameter with respect to detection values in a range among detection values detected from the respective detection devices in the sections of cycles WC, in this method, an average of all of the detection values in each section of cycle WC is calculated for each parameter, and the respective detection values in the very section are compensated for each parameter based on the average calculated. This compensation is also performed for each cycle WC.

Specifically, first, an average of all detection values in a section of cycle WC to be compensated is calculated for each parameter k. In particular, in Eq. 12 described above, p is the sequential number for the first wafer of the section of cycle WC to be compensated, q is the sequential number for the final wafer of the section of cycle WC to be compensated. The calculated average of the detection values for each cycle WC is set as $x_k''$ (k=1, 2, . . . K).

Next, by subtracting the average $x_k''$ from the respective detection values in the section of cycle WC for each parameter, all of the detection values in the cycle WC are compensated. Detection values $X_{SUB}$ obtained after the compensation by subtracting the average $x_k''$ for each parameter k are expressed as Eq. 15 by using X of Eq. 1.

$$X''_{SUB} = X - \begin{bmatrix} x_1'' & x_2'' & \cdots & x_K'' \\ x_1'' & x_2'' & \cdots & x_K'' \\ \vdots & \vdots & \cdots & \vdots \\ x_1'' & x_2'' & \cdots & x_K'' \end{bmatrix} \quad \text{Eq. 15}$$

(Fourth Compensation Method by the First Embodiment)

Further, as another compensation method, in addition to calculating the average $x_k''$ as described above, a standard deviation S of all of the detection values in the section of cycle WC to be compensated is also calculated for each parameter k. Then, the respective detection values in the section of cycle WC may be compensated by dividing a value obtained by subtracting the average $x_k''$ from the respective values in the section of the cycle WC by the standard deviation S. Detection values $X_{DIV}''$ obtained after the compensation by subtracting the average $x_k''$ and then by dividing with the standard deviation S for each parameter k are expressed as Eq. 16 by using X of Eq. 1. In Eq. 16, the matrix of the standard deviation S on the right side is a diagonal matrix.

$$X''_{DIV} = X''_{SUB} \begin{bmatrix} S_1'^{-1} & 0 & \cdots & 0 \\ 0 & S_2'^{-1} & \cdots & \vdots \\ \vdots & \vdots & \cdots & 0 \\ 0 & \cdots & 0 & S_K'^{-1} \end{bmatrix} \quad \text{Eq. 16}$$

(Fifth Compensation Method by the First Embodiment)

Further, as another compensation method, an average $x_k''$ and a standard deviation S for all of the detection values in the section of cycle WC to be compensated are calculated for each parameter k. Then, the respective detection values in the section of cycle WC may be compensated by dividing the value obtained by subtracting the average $x_k''$ from the respective values in the section of cycle WC by the standard deviation S and then performing a loading compensation for the values thus obtained. Detection values $X_{DIV}$" obtained after the compensation by employing the average $x_k$" and the standard deviation S as described above for each parameter k are expressed as Eq. 17 by using X of Eq. 1. In Eq. 17, for $R_{nk}$" on the right side, the values thereof are differentiated by a cycle WC used in building a model and another cycle WC for evaluating the model. For example, in case a model is built by performing the principal component analysis by using detection values of the cycle WC1 to evaluate detection values of the cycle WC2, it is expressed as Eq. 18. In Eq. 18, $t_{W2na}$ indicates the $a^{th}$ principal component score of the $n^{th}$ wafer of the cycle WC2, and $p_{w1ka}$ and $p_{w2ka}$ represent loadings of the parameters k of the $a^{th}$ principal components of the cycles WC and WC2, respectively.

$$X''_{ROD} = X''_{DIV} + \begin{bmatrix} R''_{11} & R''_{12} & \cdots & R''_{1K} \\ R''_{21} & R''_{22} & \cdots & R''_{2K} \\ \vdots & \vdots & \cdots & \vdots \\ R''_{N1} & R''_{N2} & \cdots & R''_{NK} \end{bmatrix} \quad \text{Eq. 17}$$

$$R''_{nk} = \sum_{a=1}^{A} t_{w2na}(p_{w1ka} - p_{w2ka}) \quad \text{Eq. 18}$$

Hereinafter, there will be reviewed results of an experiment wherein a principal component analysis was performed by using data compensated through the compensation method described above with the compensation unit 210. The principal component analysis was carried out based on detection values from the detection devices for each wafer in case an etching process is performed on a silicon film on the wafer as the plasma processing. As the etching conditions, the high frequency power applied to the lower electrode was 4000 W and its frequency was 13.56 MHz. Further, the pressure in the processing chamber was 45 mTorr, and as the processing gas, a gaseous mixture of $C_4$ of 80 sccm, $O_2$ of 20 sccm and Ar of 350 sccm was used.

Figure 9:
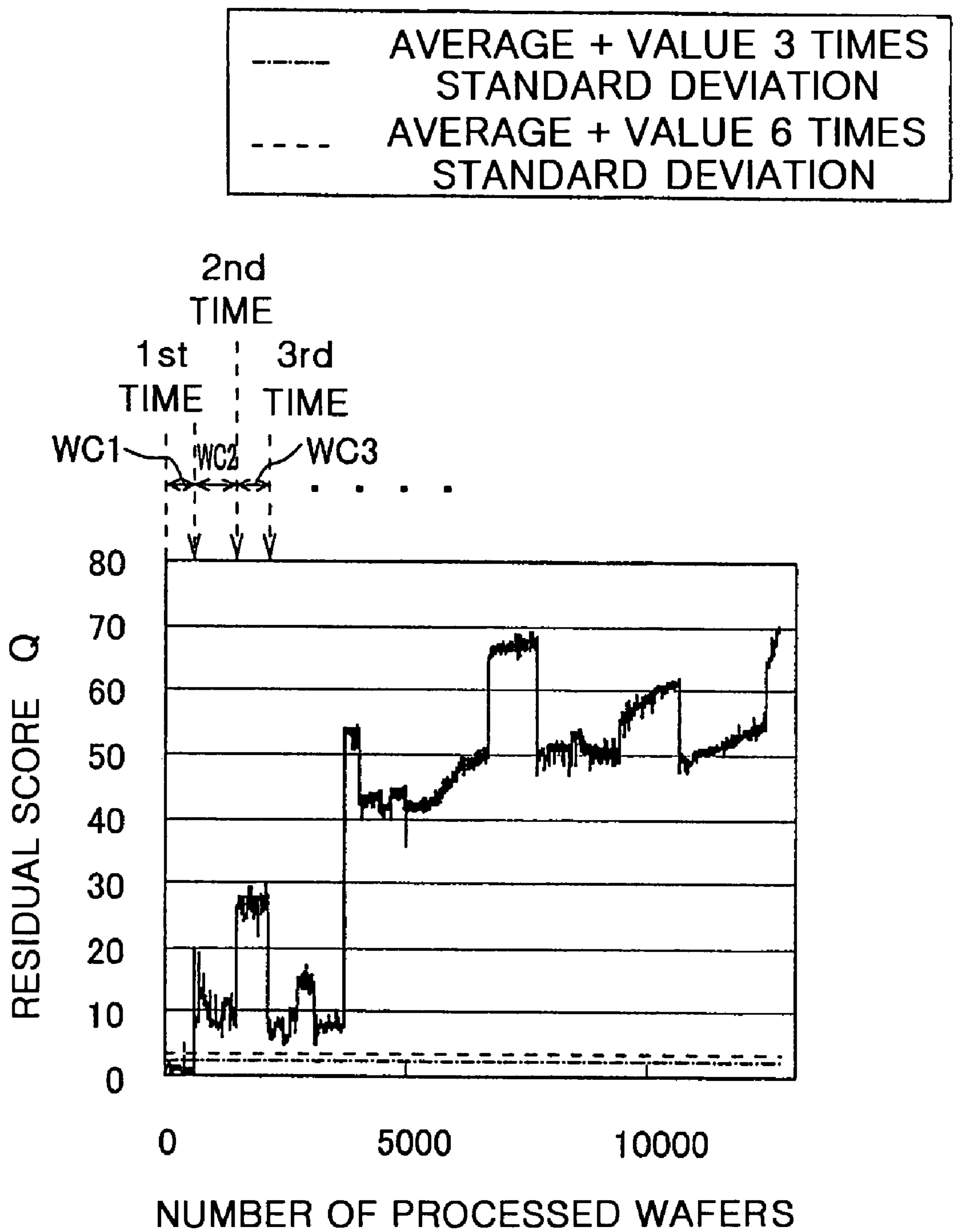
FIG. 9 provides a graph showing residual scores Q in a case where a principal component analysis is performed by using detection values subjecting to no compensation and a model is created by using the detection values in the cycle WC1.

First, results of the residual score (sum of residual square) Q obtained by performing the principal component analysis by using detection values that were not compensated are shown in FIG. 9 for the comparison with a case where the respective detection values were compensated by the compensation unit 210. FIG. 9 is a graph indicating results of the residual scores obtained for the detection values of all of the cycles WC1, WC2 and so on based on a model which is constructed by performing a principal component analysis with the analysis unit 212 by using the detection values of the cycle WC1 to obtain an eigenvalue and an eigenvector.

In FIG. 9, as similarly to the cases of FIGS. 3 and 4, the residual scores Q are greatly changed from before to after each wet cleaning is performed, thereby implying that the deviations thereof has occurred. It is considered that the change (shift error) in trend of the apparatus status (trend of the respective detection values) caused by performing the wet cleaning is one of the causes. Further, at the cycle WC1 in FIG. 9, the residual scores Q fall within a tolerance range (e.g., under the dashed dotted line or the dotted line) where the apparatus status is determined as normal. This is because the principal component analysis was performed by using the detection values of the very cycle. In addition, in FIGS. 9 to 12, the dashed dotted line is for a value of the sum of an average of the residual scores Q and a value 3 times a standard deviation, and the dotted line is for a value of the sum of an average of the residual scores Q and a value 6 times a standard deviation.

Figure 10:
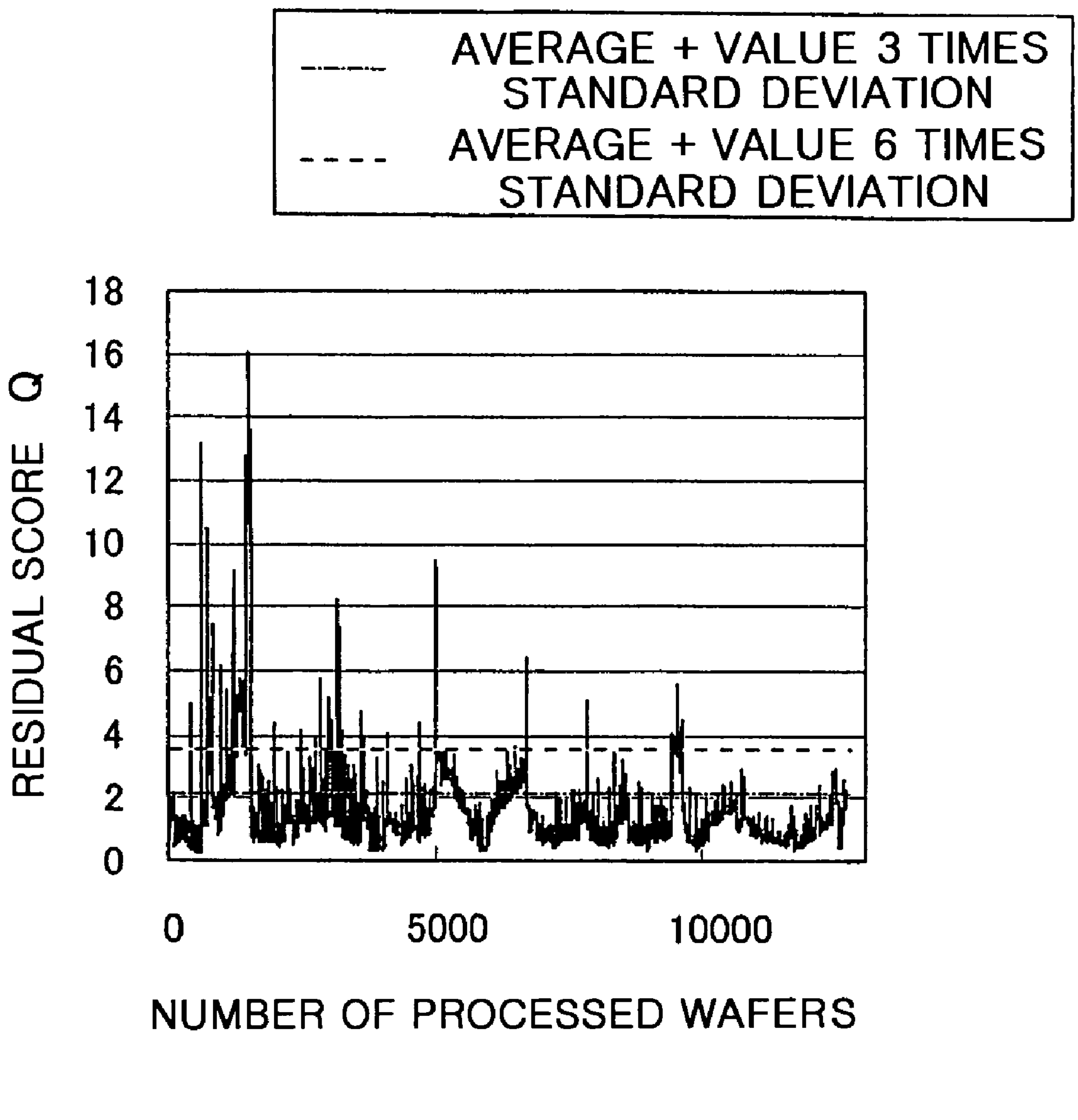
FIG. 10 sets forth a graph showing residual scores Q in a case where a compensation is performed by using an average of all detection values in a cycle and a model is created by using the detection values in the cycle WC1.
Figure 11:
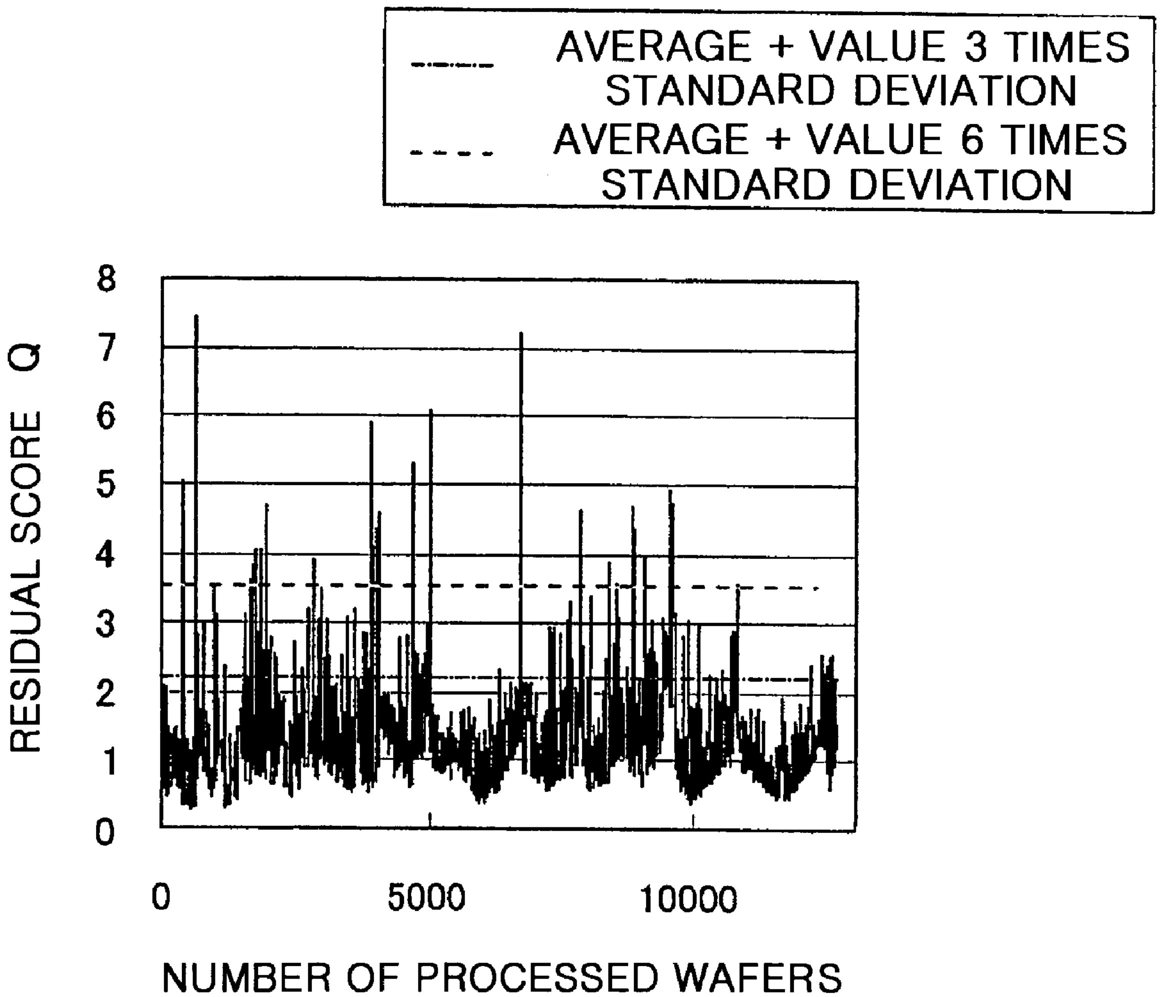
FIG. 11 describes a graph showing residual scores Q in a case where a compensation is performed by using an average and a standard deviation of all detection values in a cycle and a model is created by using the detection values in the cycle WC1.
Figure 12:
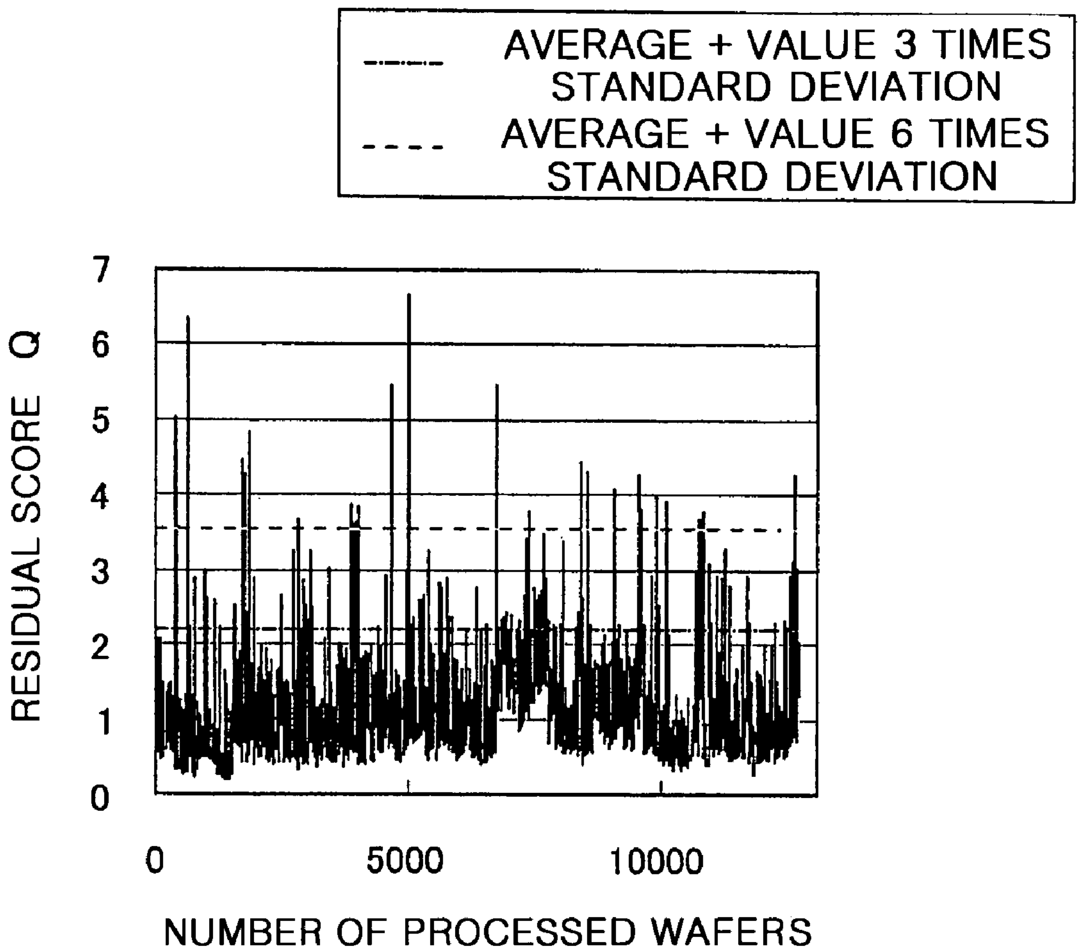
FIG. 12 depicts a graph showing residual scores Q in a case where a compensation is performed by using an average, a standard deviation and a loading of all detection values in a cycle and a model is created by using the detection values in the cycle WC1.

Next, with reference to FIGS. 10 to 12, there will be described experimental results of cases wherein compensation was carried out by the compensation method described above. FIGS. 10 to 12 are graphs indicating results of the residual score obtained for the compensated detection values of all of the cycles WC1, WC2 and so on based on a model which is built by performing a principal component analysis by using the compensated detection values of the cycle WC1 to obtain an eigenvalue and an eigenvector.

FIG. 10 indicates an experimental result of a case wherein a compensation was performed by subtracting an average from all of the detection values of each cycle WC for each parameter, FIG. 11 shows an experimental result of a case wherein a compensation was performed by dividing a value obtained through the subtraction of the average by a standard deviation calculated for each parameter in the all of the detection values of the cycle WC, and FIG. 12 represents an experimental result of a case wherein a loading compensation was further performed for a value obtained by dividing with the standard deviation.

As can be seen from FIGS. 10 to 12, the residual scores Q are not greatly changed between before and after each wet cleaning. Accordingly, the great change (shift error) of the residual scores Q between before and after each wet cleaning which occurred in FIG. 9 is eliminated. As such, by performing the compensation by using the average and the like for the detection values in each cycle WC in the compensation unit 210, it is also possible to eliminate the deviation in trend of the apparatus status due to the wet cleaning to thereby enhance an analysis accuracy of the principal component analysis.

In accordance with this embodiment described above, for sections defined whenever an operation for improving the processing environment or processing prediction environment in the apparatus (for example, a maintenance work such as a cleaning in the apparatus and replacement of consumable parts or detection devices) is performed, a compensation processing is performed for detection values detected in each of the sections and a multivariate analysis is performed by using the compensated detection values as analysis data. Therefore, even if trend of the apparatus status is changed due to the maintenance operation and the detection values used in the multivariate analysis is changed, such changes can be prevented from affecting the result of the multivariate analysis. As a result, accuracy of the status prediction of the apparatus or the status prediction of objects to be processed can be increased, and information on the plasma processing can be accurately monitored all the time.

Furthermore, merely with a simple process of compensating detection values for each section, it can be prevented that the change in trend of the detection values affects the result of the multivariate analysis, so that labor and time required to, e.g., reconstruct a model by the multivariate analysis can be eliminated.

Moreover, although there has been described the case where the principal component analysis is performed as the multivariate analysis by using the detection values compensated as mentioned above in the first embodiment, the present invention is not limited thereto. A multiple regression analysis such as the PLS method may be performed by using the detection values subject to the above-described compensation. In the PLS method, a plurality of plasma reflection parameters are used as explanatory variables and objective variables are employed as the control parameters and the apparatus status parameters to construct a model equation (a prediction equation such as a regression equation, and a correlation equation) wherein the explanatory variables and the objective variables are related to each other. Then, by merely applying the parameters as the explanatory variables to the model equation constructed, the parameters of the explanatory variables can be predicted. The details of the PLS method is published in, e.g., JOURNAL OF CHEMOMETRICS, VOL. 2(PP. 211–228)(1998).

As described above, the detection values from the electrical measurement device 107C, the optical measurement device 120 and the parameter measurement device 121 are compensated and the multivariate analysis is performed by the PLS method by using the parameters of the compensated detection values. Therefore, in case of performing a prediction for the control parameters or the apparatus status parameters and a process prediction for uniformity of an etching rate, pattern dimensions, etching patterns, damages and the like, even when the trend of the detection values used in the multivariate analysis is changed due to the change in trend of the apparatus status by a maintenance of the apparatus, it is possible to prevent such change from affecting the results of the multivariate analysis, thereby enhancing accuracy of the predictions. Further, the parameter measurement devices 121 are measurement devices for measuring the control parameters. When actually performing the multivariate analysis, it is not necessary to use all of the data and the multi regression analysis such as the PLS method is performed with at least one kind of data from the electrical measurement device 107C, the optical measurement device 120 and the parameter measurement device 121. Accordingly, the data from all of the measurement devices may be used, or the data from only the electrical measurement device 107C or the optical measurement device 120 may be used.

(Second Preferred Embodiment)

Hereinafter, a second preferred embodiment of the present invention will be described with reference to the drawings. Since configurations of a plasma processing apparatus and a multivariate analysis unit in accordance with the second preferred embodiment are identical to those shown in FIGS. 1 and 2, respectively, detailed descriptions thereon will be omitted.

A compensation unit 210 forms a pre-processing unit for compensating (pre-processing) a current detection value detected by the respective detection devices based on a detection value previously detected before it. That is, by compensating the current detection value in consideration of the previous detection values and performing the multivariate analysis for the compensated detection value, shift errors in the analysis results between before and after a maintenance such as a wet cleaning and aging errors of analysis results due to a long operation of the plasma processing apparatus can be eliminated. The analysis unit 212 performs the multivariate analysis by using as analysis data the detection values compensated by the compensation unit 210.

(Compensation Method in the Second Embodiment)

Hereinafter, there will be described with reference to the drawings specific examples of the compensation method (pre-processing method) performed by the compensation unit 210 in accordance with the second preferred embodiment. In this embodiment, current detection values detected by the detection devices are compensated based on detection values previously detected and the compensated detection values are taken as analysis data. For example, an exponentially weight moving average ("EWMA") processing is performed to compensate the detection values detected by the respective detection devices.

Generally, the EWMA processing is a method for predicting a next value from data accumulated in advance by using a weight $\lambda$ ($0<\lambda<1$). For example, where the weight of the $i^{th}$ data is $v_i$ and time is t, it is possible to express as $v_i=\lambda(1-\lambda)^{t-1}$, and the weight decreases exponentially from the value at time t. From the equation, if the weight is close to 0, next value (prediction value) will be a value obtained by sufficiently taking the accumulated data into consideration, while to the contrary, if the weight is close to 1, next value (prediction value) will be a value obtained by taking the last data into consideration greatly.

The details of the EWMA processing are disclosed in, e.g., Artificial neural network exponentially weighted moving average controller for semiconductor processes (1997 American Vacuum Society PP. 1377–1388) and Run by Run Process Control: Combining SPC and Feedback Control (IEEE Transactions on Semiconductor Manufacturing, Vol. 8, No. 1, February 1995 PP. 26–43).

Herein, for example, as a compensation by the EWMA processing, a current prediction value for a current detection value detected by a corresponding detection device for each parameter is calculated by averaging a weighted last prediction value and a weighted last detection value. Specifically, where the current prediction value for detection value of the $i^{th}$ wafer is $Y_i$, an actual detection value of the $(i-1)^{th}$ wafer immediately before it is $X_i$, and the weight is $\lambda$, the current prediction value $Y_i$ is expressed by Eq. 19.

$$Y_i=\lambda\times X_{i-1}+(1-\lambda)\times Y_{i-1} \quad \text{Eq. 19}$$

Next, the current detection value is compensated by subtracting the current prediction value $Y_i$ from the current detection value $X_i$. Where the compensated detection value is $X_i'$, $X_i'$ is expressed by Eq. 20.

$$X_i'=X_i-Y_i \quad \text{Eq. 20}$$

Further, as a compensation by the EWMA processing, the current prediction value for the current detection value detected by the corresponding detection device for each parameter may be calculated by averaging a weighted last prediction value and a weighted current detection value. With such compensation, the same detection value is obtained. In this case, the current prediction value $Y_i$ is calculated by using Eq. 21 in lieu of Eq. 19.

$$Y_i=\lambda\times X_i+(1-\lambda)\times Y_{i-1} \quad \text{Eq. 21}$$

As described above, by compensating detection values through the EWMA processing in the compensation unit 210, the current detection values can be compensated in consideration of the trend of the last detection values. Accordingly, by performing the multivariate analysis for the compensated detection values, shift errors of the analysis results between before and after a maintenance such as a wet cleaning and aging errors of analysis results due to a long operation of the plasma processing apparatus can be eliminated. Further, the detection values can be compensated in real time by the compensation based on last or current detection values through the EWMA processing.

Subsequently, there will be reviewed results of an experiment wherein a principal component analysis was performed by using data compensated through the above compensation method in the compensation unit 210. The principal component analysis was carried out based on detection values from the detection devices for each wafer when an etching process is performed on a silicon film on the wafer as the plasma processing. As the detection values, detection values obtained by measuring a high frequency voltage V, a high frequency current I, a high frequency power P and an impedance Z as VI probe data (electrical data) based on the plasma via the electrical measurement device (e.g., a VI probe) 107C at four kinds of a fundamental wave to a quadruple wave are used.

As the etching conditions in the second embodiment, the high frequency power applied to a lower electrode was 4000 W, the pressure in the processing chamber was 50 mTorr, and a gaseous mixture of $C_4F_8$ of 20 sccm, $O_2$ of 10 sccm, CO of 100 sccm and Ar of 440 sccm was used as the processing gas.

Figure 13:
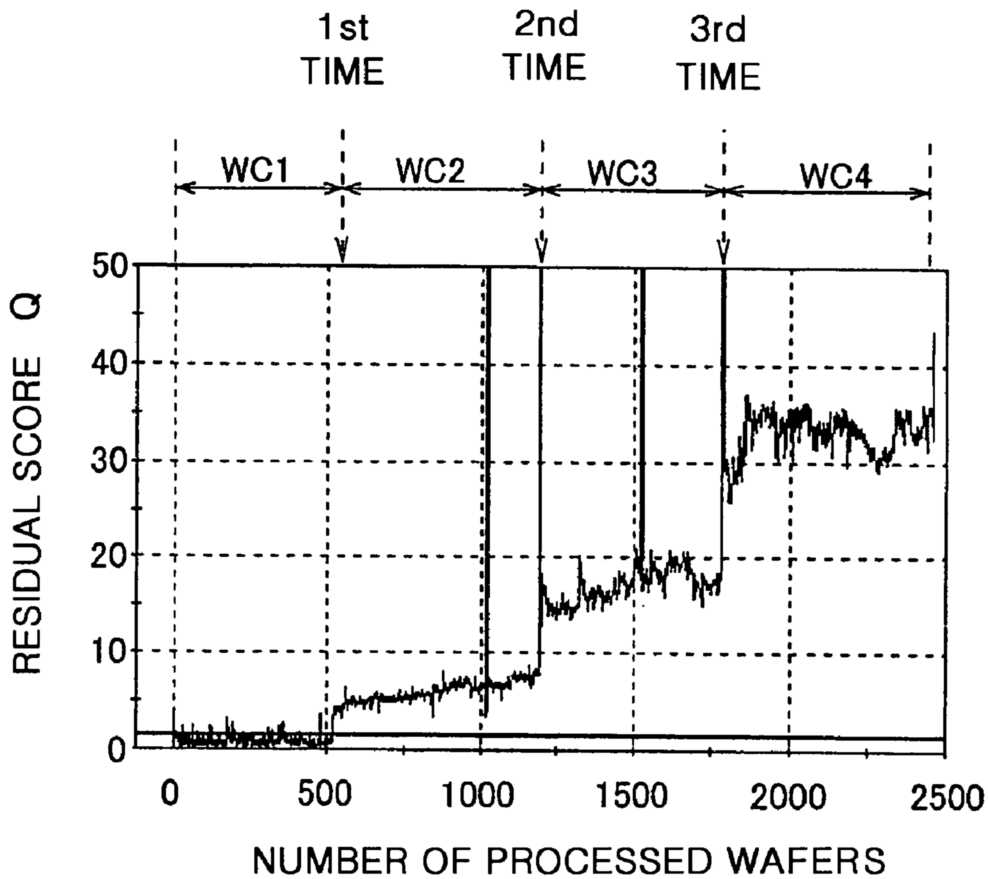
FIG. 13 represents a graph showing residual scores Q in a case where a principal component analysis is performed by using detection values subject to no compensation to create a model in accordance with a second preferred embodiment of the present invention.

First, FIG. 13 shows results of the residual score (sum of residual square) Q obtained by performing the principal component analysis by using detection values that were not compensated for the comparison with a case where the respective detection values were compensated by the compensation unit 210. Herein, as the detection values, detection values detected by the respective detection devices whenever the wafers are etched under the aforementioned conditions are used as the analysis data without being compensated. Further, in FIG. 13, dotted arrows indicate points of time when the wet cleanings were performed, and the vertical axis and the horizontal axis represent the residual score Q and the number of processed wafers, respectively. (These are also applied to FIG. 14.) In FIG. 13, a section from an initial wafer data to the first wet cleaning is set as cycle WC1, a section from the first wet cleaning to the second wet cleaning is set as cycle WC2, a section from the second wet cleaning to the third wet cleaning is set as cycle WC3, and a section from the third wet cleaning to a final wafer data is set as cycle WC4.

FIG. 13 is a graph indicating results of the residual scores obtained for the detection values of all of the cycles WC1 to WC4 based on a model which is constructed by performing a principal component analysis with the analysis unit 212 by using the detection values of the cycle WC1 to obtain an eigenvalue and an eigenvector.

As can be seen from FIG. 13, the residual scores Q are greatly changed between points of time before and after each wet cleaning is performed, resulting in shift errors. The change (shift error) in trend of the apparatus status (trend of the respective detection values) caused by performing the wet cleaning is considered as one of the causes. Further, if sections defined whenever each wet cleaning is performed are set as wet cycles WC1 to WC4, in each wet cycle section, the sum of residual square Q is gradually changed so that the trend (gradient) in the section is increased as a whole in a right-upper direction, thereby resulting in aging errors. It is considered as one cause that, since a plasma is generated by introducing a processing gas in the processing chamber in the plasma processing apparatus 100, reaction products (depositions) are deposited inside the processing chamber due to the operation of the plasma processing apparatus to contaminate the detection devices and the data from the detection devices are gradually changed. At the cycle WC1 in FIG. 13, the residual scores Q fall within a tolerance range (e.g., under the solid line) where the apparatus status is determined to be normal. This is because the principal component analysis has been performed by using the detection values of the very cycle. In addition, in FIGS. 13 to 15, the solid line is a value of the sum of an average of the residual scores Q and a value 3 times a standard deviation.

Figure 14A:
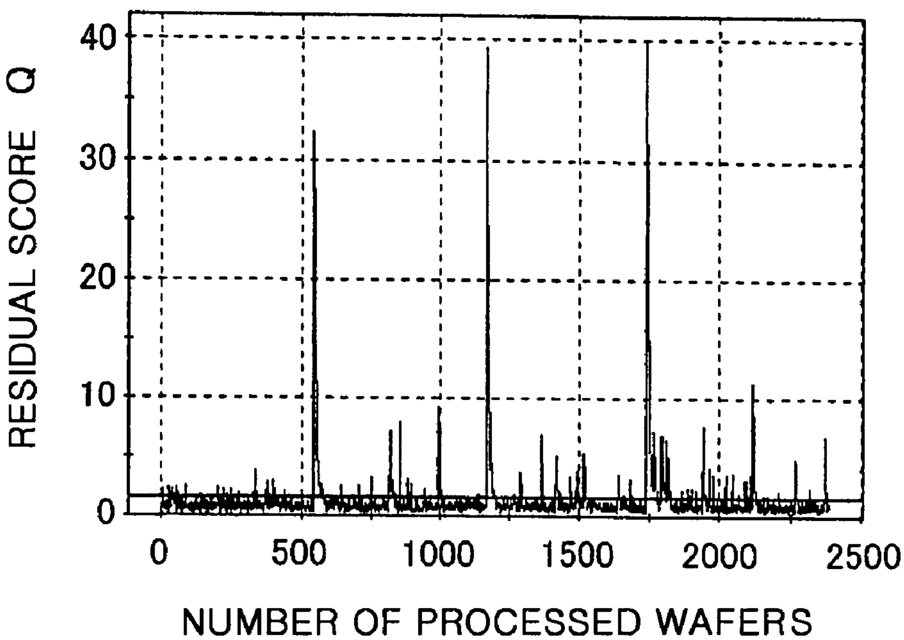
FIG. 14 provides a graph showing residual scores Q in a case where a principal component analysis is performed by using detection values subject to a compensation by an exponentially weight moving average ("EWMA") processing to create a model.
Figure 14B:
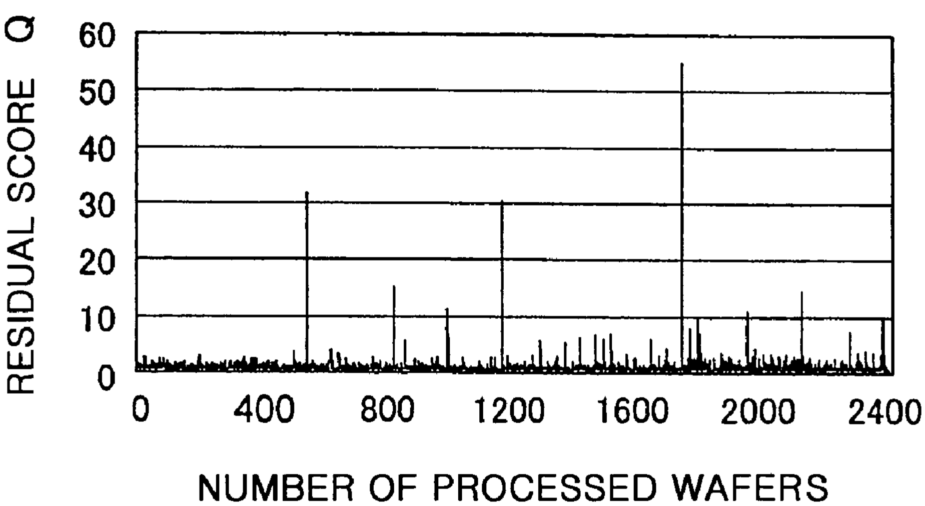

Next, with reference to FIGS. 14A, 14B and 15, there will be described an experimental result of a case wherein a compensation (pre-processing) by the EWMA processing was carried out for each parameter. FIGS. 14A and 14B are graphs indicating results of the residual scores obtained for the compensated detection values of all of the cycles WC1 to WC4 based on a model which is built by performing a principal component analysis by using the compensated detection values of the cycle WC1 to obtain an eigenvalue and an eigenvector. FIG. 14A is a case where the weight $\lambda$ is set as $\lambda$=0.1 and FIG. 14B is a case where the weight $\lambda$ is set as $\lambda$=0.9 in Eq. 19 (or Eq. 21).

In both FIGS. 14A and 14B, the residual scores Q are not greatly changed between before and after each wet cleaning. Further, also even in the section of each cycle WC, the trend (gradient) is horizontal as a whole. Accordingly, the shift error of the residual scores Q between before and after each wet cleaning which occurred in FIG. 13 and the aging errors are all eliminated. Moreover, in the residual scores Q of all cycles WC1 to WC4, since almost all detection values fall within a certain constant range (e.g., a range of the sum of an average and a value 3 times a standard deviation), it can be accurately determined that the apparatus status is normal.

Hereinafter, an influence on the analysis accuracy caused by a change in the high frequency power P applied to the lower electrode 102 will be reviewed. FIG. 15 is a graph indicating the residual scores Q obtained by changing the high frequency power P in a range of 3880 W to 4120 W. In FIG. 15, a curve plotted by black circles is for residual scores Q in the section of cycle WC1 and a curve plotted by black squares is for residual scores Q in the section of cycle WC4.

Figure 15:
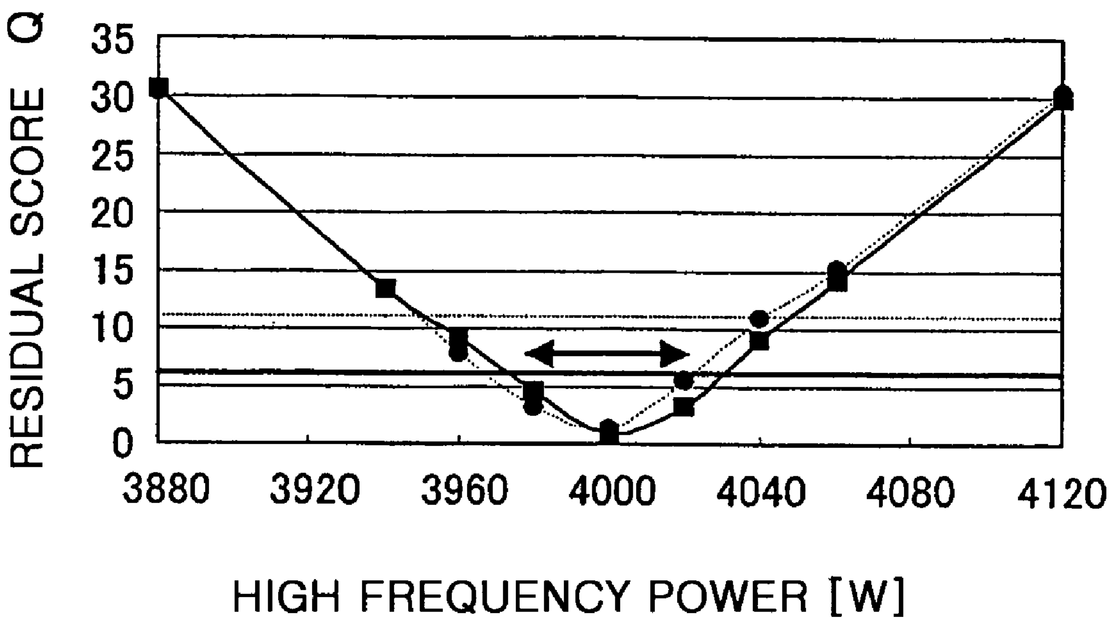
FIG. 15 shows a relationship of a high frequency power and the residual scores.

As can be seen from FIG. 15, the residual scores Q in the cycles WC1, WC4 are both indicated by the graphs in a V-shape. In the graphs, the residual scores Q have the smallest at the high frequency power of 4000 W, and fall within a tolerance range in a high frequency power range between 3970 W and 4030 W (e.g., under the solid line) where the apparatus status is determined to be normal. Accordingly, the analysis accuracy is lowest when the high frequency power applied to the lower electrode 102 is 4000 W. Further, in case, e.g., the tolerance range, where the apparatus status is determined to be normal, is set as a range under a value of an average of the residual score Q plus a value 3 times a standard deviation, the analysis accuracy becomes good under the condition that the high frequency power is in the tolerance range (e.g., a range of 3970 W to 4030 W).

In accordance with this embodiment described above, by performing a compensation by the EWMA processing in the compensation unit 210, it is possible to eliminate aging errors as well as shift errors occurred at indexes such as the residual score Q due to a change in trend of the detection values by a maintenance such as a cleaning in the apparatus and replacement of consumable parts or detection devices, and by a long term operation of the plasma processing apparatus 100. Therefore, since the abnormality of the apparatus can be accurately determined, the analysis accuracy by the principal component analysis can be enhanced. As a result, accuracy of, e.g., the abnormality detection of the plasma processing apparatus 100 can be increased and information on the plasma processing can be accurately monitored all the time.

(Third Preferred Embodiment)

Hereinafter, a third preferred embodiment of the present invention will be described with reference to the drawings. Since configurations of a plasma processing apparatus and a multivariate analysis unit in accordance with the third preferred embodiment are identical to those shown in FIGS. 1 and 2, respectively, detailed descriptions thereon will be omitted.

In the third preferred embodiment, there is described a case where analysis data, after compensated by the compensation unit 210 mentioned in the second preferred embodiment, are used when the multivariate analysis unit 200 constructs a model (a regression equation) by the PLS method (partial least squares method) to predict a status of the plasma processing apparatus 100 and a status of objects to be processed.

In the third preferred embodiment, the multivariate analysis unit 200 produces the following relational equation Eq. 22 (prediction equation or a model such as a regression equation), in which plasma reflection parameters such as the optical data and the VI probe data are set to explanatory variables and process parameters such as the control parameter and the apparatus status parameter are set to explained variables (objective variables), by using the multivariate analysis program. In the following regression equation Eq. 22, X represents a matrix of the explanatory variables, and Y represents a matrix of the explained variables. Further, B is a regression matrix comprised of coefficients (weighting coefficients) of the explanatory variables and E is a residual matrix.

$$Y=BX+E \qquad \text{Eq. 22}$$

In the third preferred embodiment, in order to obtain Eq. 22, for example, the Partial Least Squares (PLS) method disclosed in JOURNAL OF CHEMOMETRICS, VOL. 2, (PP. 211–218), 1998 is used. Even though a plurality of explanatory variables and explained variables are included in the matrices X and Y, respectively, the PLS method can obtain a relational equation between X and Y if a small number of actual measurement values exist in X and Y, respectively. Moreover, the PLS method is characterized in that, even though the relational equation is obtained from a small number of actual measurement values, stability and reliability thereof are high.

In the third preferred embodiment, a program for the PLS method is stored in the multivariate analysis program storage unit 201, so that the explanatory variables and the objective variables are processed by the multivariate analysis processing unit 208 in accordance with the sequence of the program to obtain the above Eq. 22 and the process results thereof are stored in the multivariate analysis result storage unit 205. Therefore, in the third embodiment, after Eq. 22 is obtained, by applying the plasma reflection parameter (the optical data and the VI probe data) to the matrix X as the explanatory variables, the process parameters (the control parameters and the apparatus status parameters) can be predicted. Moreover, the prediction has a high reliability.

For example, with respect to a matrix $X^TY$, a vector of the $a^{th}$ principal component score corresponding to the $a^{th}$ eigenvalue is represented by $t_a$. The matrix X is expressed by the following Eq. 23 by using both the $a^{th}$ principal component score $t_i$ and an eigenvector (loading) $p_a$, and the matrix Y is expressed by the following Eq. 24 by using both the $a^{th}$ principal component score $t_i$ and an eigenvector (loading) $c_a$. Further, in the following Eqs. 23 and 24, $X_{a+1}$ and $Y_{a+1}$ are the residual matrices of X and Y, respectively, and $X^T$ is a transposed matrix of X. Hereinafter, an exponent T is used to represent a transposed matrix.

$$X=t_1p_1+t_2p_2+t_3p_3+ \ldots +t_ap_a+X_{a+1} \qquad \text{Eq. 23}$$

$$Y=t_1c_1+t_2c_2+t_3c_3+ \ldots +t_ac_a+Y_{a+1} \qquad \text{Eq. 24}$$

In this way, the PLS method used in the third embodiment is employed to calculate a plurality of eigenvalues and the eigenvectors thereof by using a small quantity of calculation in the case where Eqs. 23 and 24 are correlated with each other.

The PLS method is performed in accordance with the following sequence. In a first stage thereof, centering and scaling operations for the matrices X and Y are performed. Then, by setting a to "1", $X_1=X$ and $Y_1=Y$ are obtained. Further, a first column of the matrix $Y_1$ is set to $u_1$. Herein, the centering represents an operation of subtracting an average of each row from individual element values of the row, and the scaling represents an operation (process) of dividing the individual element values of the row by a standard deviation of the row.

In a second stage of the method, after $w_a=X_a^Tu_a/(u_a^Tu_a)$ is calculated, a determinant of $w_i$ is normalized and then $t_a=X_aw_a$ is obtained. Further, the same process is executed for the matrix Y, i.e., after $c_a=Y_a^Tt_a/(t_a^Tt_a)$ is calculated, a determinant of $c_a$ is normalized and then $u_a=Y_ac_a/(c_a^Tc_a)$ is obtained.

In a third stage of the method, an X loading $p_a=X_a^Tt_a/(t_a^Tt_a)$ and a Y loading $q_a=Y_a^Tu_a/(u_a^Tu_a)$ are obtained. Next, $b_a=u_a^Tt_a/(t_a^Tt_a)$ is obtained by allowing u to regress to t. Subsequently, residual matrices $X_a=X_a-t_ap_a^T$ and $Y^a=Y_a-b_at_ac_a^T$ are obtained. Further, after a is increased to be a+1, the processes of the second and the third stages are repeated. A series of these processes are repeatedly executed by the program of the PLS method until a predetermined stop condition is satisfied or the residual matrix $X_{a+1}$ converges to "0", thus obtaining a maximum eigenvalue of the residual matrix and an eigenvector thereof.

In the PLS method, the residual matrix $X_{a+1}$ rapidly converges to the stop condition or "0" such that repeating the above stages approximately ten times is enough for the residual matrix to converge to the stop condition or "0". Generally, the residual matrix converges to the stop condition or "0" by iterating the stages four or five times. By using the maximum eigenvalue and the eigenvector thereof obtained by the above calculating process, a first principal component of the matrix $X^TY$ can be obtained and a maximum correlation between the X and Y matrices can be detected.

When obtaining the model equation (regression equation) such as Eq. 22 by using the PLS method as explained above, a plurality of explanatory and objective variables are measured in advance by an experimental run performed by using a training set of wafers. For this purpose, e.g., a set of 18 wafers (TH—OX Si) was prepared. TH—OX Si indicates wafers coated with a thermal oxide layer. As the etching conditions in the third embodiment, the high frequency power applied to a lower electrode was 4000 W, the pressure in the processing chamber was 50 mTorr, and as the processing gas, a gaseous mixture of $C_4F_8$ of 10 sccm, $O_2$ of 5 sccm, CO of 50 sccm, and Ar of 200 sccm was used.

In this case, such an experiment plan approach helps effective setting of each parameter data. In this preferred embodiment, for example, the control parameters that serve as the objective variables within a predetermined range are varied centering around a standard value, for each training wafer; thereafter, the training wafers are etched. Further, the electrical data and the optical data serving as the explanatory variables during the etching process are measured multiple times with respect to each training wafer. Averages of the optical data and the VI probe data are calculated by the operation unit 106.

In this procedure, a maximum variation range of control parameters during the etching process is determined, and the control parameters are varied within the maximum variation range. In this preferred embodiment, the followings are used as the control parameters: the high frequency power; the pressure in the processing chamber 101; a gap distance between the upper and lower electrode 102 and 104; and the flow rate of each processing gas (Ar gas, CO gas, $C_4F_8$ gas, and $O_2$ gas). A standard value of each control parameter depends on an object to be etched.

For instance, when etching is performed on each training wafer, the control parameters centering around standard values are varied for each training wafer within the range of level 1 to level 2 shown in Table 1 below. While each training wafer is processed, the high frequency voltage V, the high frequency current I, the high frequency power P and the impedance Z are measured based on the plasma as the VI probe data via the electrical measurement device 107C at four kinds of the fundamental wave to a quadruple wave; and an emission spectrum intensity of a wavelength in the range of, e.g., 200 to 950 nm is measured as the optical data by the optical measurement device 120. The VI probe data and the optical data are used as the plasma reflection parameters. At the same time, each actual measurement value of the control parameters shown in Table 1 and those of the apparatus state parameters, e.g., a capacitance of each variable capacitor C1 and C2, a harmonic wave voltage Vpp, the opening degree of the APC, are measured by the respective parameter measurement devices 121.

TABLE 1

| | Power W | Pressure mTorr | Gap mm | Ar sccm | CO sccm | $C_4F_8$ sccm | $O_2$ sccm |
|---|---|---|---|---|---|---|---|
| Level 1 | 1450 | 43 | 25 | 170 | 35 | 9 | 4 |
| Standard value | 1500 | 45 | 27 | 200 | 50 | 10 | 5 |
| Level 2 | 1550 | 47 | 29 | 230 | 65 | 11 | 6 |

In processing the training wafers, each of the above control parameters is set to the standard value of the thermal oxide layer, and five dummy wafers are processed in advance in accordance with the standard values, thereby stabilizing the plasma processing apparatus 100. Subsequently, eighteen training wafers are etched. In this procedure, each control parameter is varied for each training wafer within the range of level 1 to level 2 as shown in Table 2 below. Further, in Table 2 below, reference numbers (L1 to L18) indicate the numbers of the training wafers, respectively.

TABLE 2

| No. | Power (W) | Pressure (mTorr) | Gap (mm) | Ar (sccm) | CO (sccm) | $C_4F_8$ (sccm) | $O_2$ (sccm) |
|---|---|---|---|---|---|---|---|
| L1 | 1500 | 47 | 25 | 170 | 65 | 10 | 6 |
| L2 | 1500 | 43 | 29 | 200 | 30 | 9 | 6 |
| L3 | 1500 | 45 | 27 | 230 | 65 | 9 | 4 |
| L4 | 1550 | 47 | 27 | 170 | 50 | 9 | 6 |
| L5 | 1400 | 43 | 25 | 170 | 30 | 9 | 4 |
| L6 | 1500 | 43 | 27 | 200 | 50 | 10 | 5 |
| L7 | 1550 | 43 | 25 | 230 | 50 | 10 | 4 |
| L8 | 1550 | 43 | 29 | 230 | 65 | 11 | 6 |
| L9 | 1450 | 47 | 29 | 200 | 65 | 10 | 4 |
| L10 | 1500 | 45 | 29 | 170 | 50 | 11 | 4 |
| L11 | 1550 | 45 | 25 | 200 | 65 | 9 | 5 |
| L12 | 1550 | 47 | 27 | 200 | 35 | 11 | 4 |
| L13 | 1500 | 47 | 25 | 230 | 35 | 11 | 5 |

TABLE 2-continued

| No. | Power (W) | Pressure (mTorr) | Gap (mm) | Ar (sccm) | CO (sccm) | $C_4F_8$ (sccm) | $O_2$ (sccm) |
|---|---|---|---|---|---|---|---|
| L14 | 1450 | 45 | 27 | 230 | 35 | 10 | 6 |
| L15 | 1450 | 45 | 25 | 200 | 50 | 11 | 6 |
| L16 | 1450 | 47 | 29 | 230 | 50 | 9 | 5 |
| L17 | 1550 | 45 | 29 | 170 | 35 | 10 | 5 |
| L18 | 1450 | 43 | 27 | 170 | 65 | 11 | 5 |

Furthermore, after obtaining a plurality of electrical data and a plurality of optical data from the respective measurement devices for each training wafer, averages of the VI probe data (electrical data) and the optical data of each training wafer and averages of actual detection values of the respective process parameters (the control parameters and the apparatus status parameters) are calculated. Further, the averages of the each parameter are compensated by the aforementioned EWMA processing, a model equation is constructed by using the compensated values as the explanatory variables and the objective variables. Also, the compensated values may be used only as the explanatory variables.

In addition, whenever each one of a set of test wafers for which a prediction result is to be obtained is processed, the operation unit 206 of the multivariate analysis unit 200 compensates averages of the VI probe data (electrical data) and the optical data by the EWMA processing with the compensation unit 210, and applies the compensated values to the model equation obtained from the analysis result storage unit 205 to calculate prediction values of the process parameters (the control parameters and the apparatus status parameters) for each test wafer.

Subsequently, there will be reviewed results of the prediction for process parameters in the PLS method by performing a compensation in accordance with the EWMA processing in the third preferred embodiment. Here, the compensation (pre-processing) by the EWMA processing was performed for only the VI probe data and the optical data serving as the explanatory variables. In this case, a baseline compensation may be performed for the objective variables when a model is built. As the baseline compensation, the following process may be performed: an average of, e.g., data for the $6^{th}$ and the $25^{th}$ wafers is calculated and taken as a baseline, and the average taken as the baseline is subtracted from data of the objective variables when the model is built.

Figure 16A:
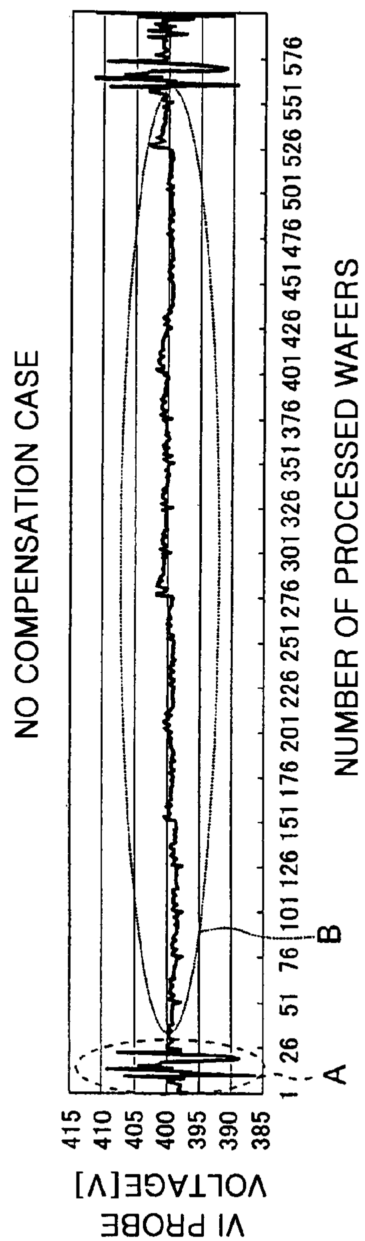
FIGS. 16A and 16B show high frequency voltage data of VI probe data before and after compensation, respectively, which are taken as an explanatory variable by partial least square method in a third preferred embodiment of the present invention.
Figure 16B:
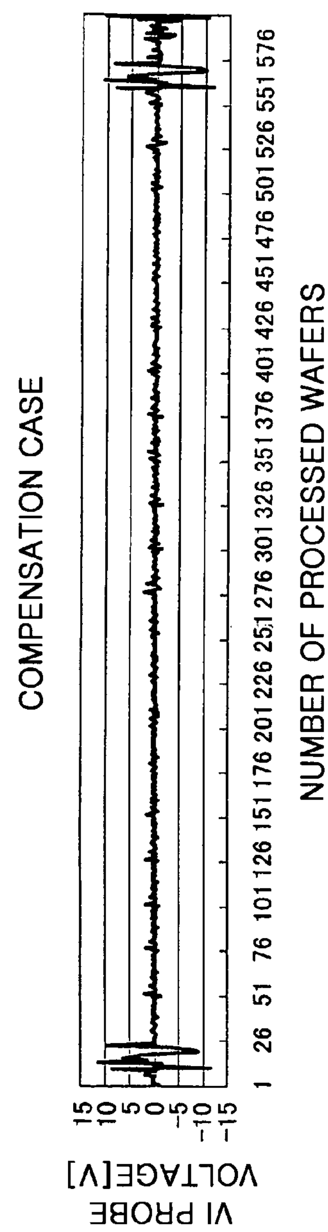
Figure 17A:
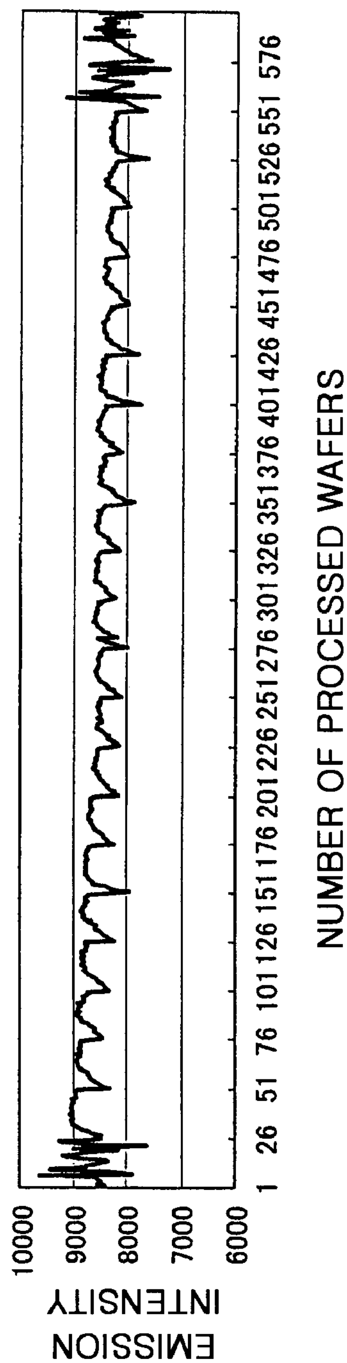
FIGS. 17A and 17B depict optical data before and after a compensation, respectively, which are taken as an explanatory variable by a partial least squares method in the third preferred embodiment of the present invention.
Figure 17B:
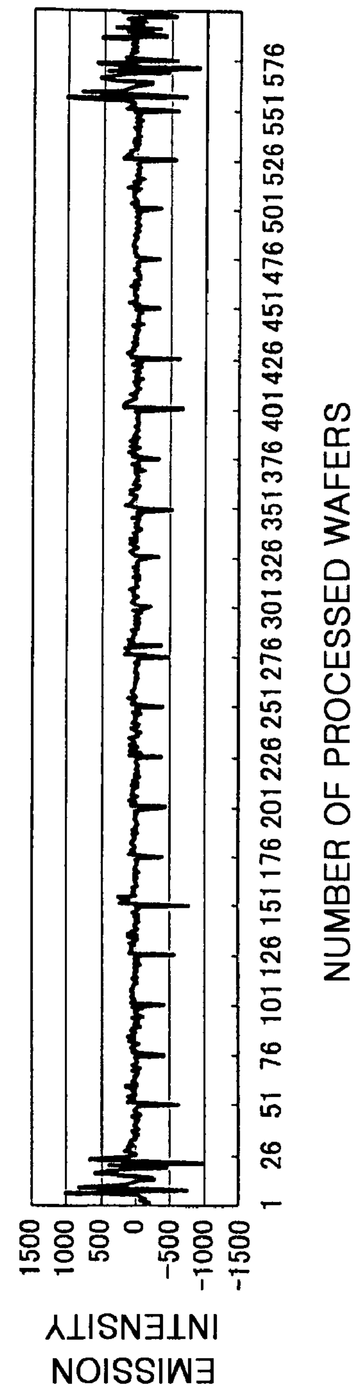

First, data before and after compensation of the VI probe data and the optical data are compared with each other. The data before and after compensation for the high frequency voltage V among the VI probe data are shown in FIGS. 16A and 16B, respectively. The data before and after the compensation for an emission intensity of a wavelength among the optical data are represented in FIGS. 17A and 17B, respectively. Further, “A” and “B” sections in FIG. 16A are for a training set and a test set, respectively. (This is also applied to FIGS. 16B to 19, wherein the indications of “A” and “B” are omitted.)

In FIG. 16A, the high frequency voltage V before compensation is gradually increased and has a trend (gradient) increasing in a right-upper direction as a whole. In FIG. 17A, the emission intensity of the optical data before compensation is gradually decreased and has a trend (gradient) decreasing in a right-lower direction as a whole. That is, it can be seen from the above, both of the data before compensation show tendency to vary as time passes.

In contrast, data after compensation in FIGS. 16B and 17B all have a trend (gradient) to be horizontal as a whole. As described above, by performing the compensation with the EWMA processing, the time dependent variation occurred in FIGS. 16A and 17A can be eliminated.

Figure 18A:
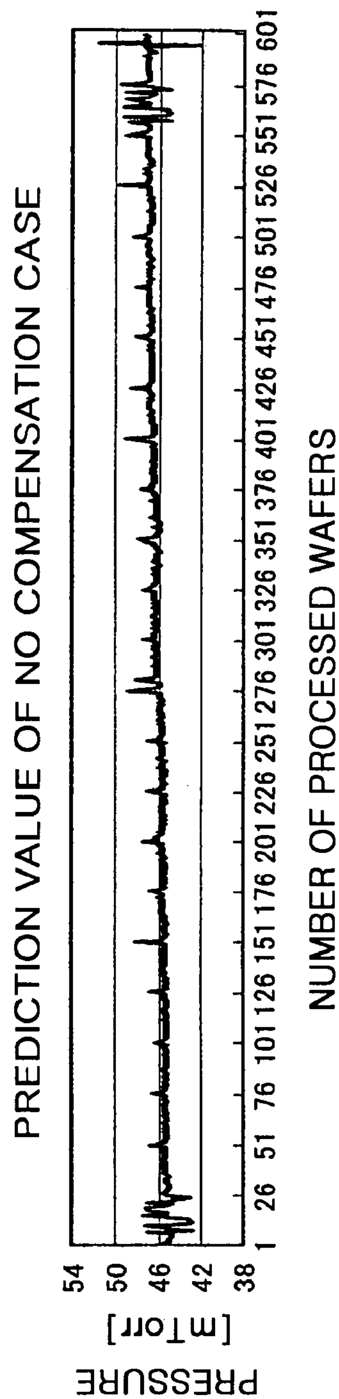
FIGS. 18A and 18B provide graphs showing prediction values of a pressure in a processing chamber in cases where models are created by the partial least squares method by using data subject to no compensation and subject to compensation, respectively.
Figure 18B:
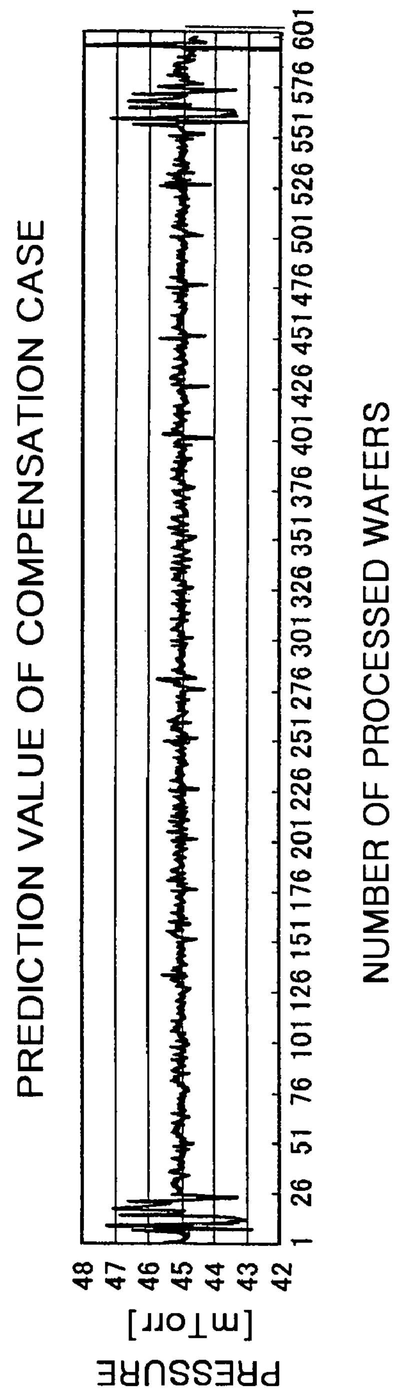
Figure 19A:
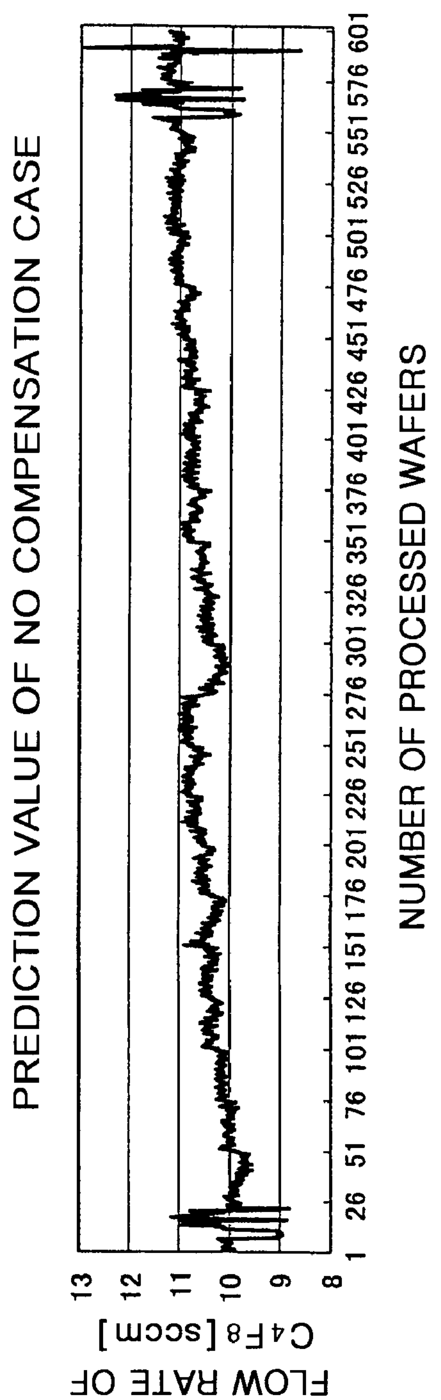
FIGS. 19A and 19B are graphs showing prediction values of a flow rate of $C_4F_8$ in cases where models are created by the partial least square method by using data subject to no compensation and subject to compensation, respectively.

Then, by using the VI probe data and the optical data after compensation as shown in FIGS. 16B and 17B, a model was constructed with the data in the A section, and the process data (high frequency power P, pressure in the processing chamber, gap between the electrodes, flow rate of the processing gas and the like) were predicted with the data in the B section. Among them, prediction values of the pressure in the processing chamber and the flow rate of $C_4F_8$ are respectively indicated in FIGS. 18A, 18B and 19A, 19B. FIGS. 18A and 19A show prediction results by using VI probe data and optical data that have not been compensated, FIGS. 18B and 19B indicate prediction results by using VI probe data and optical data that have been compensated.

Figure 19B:
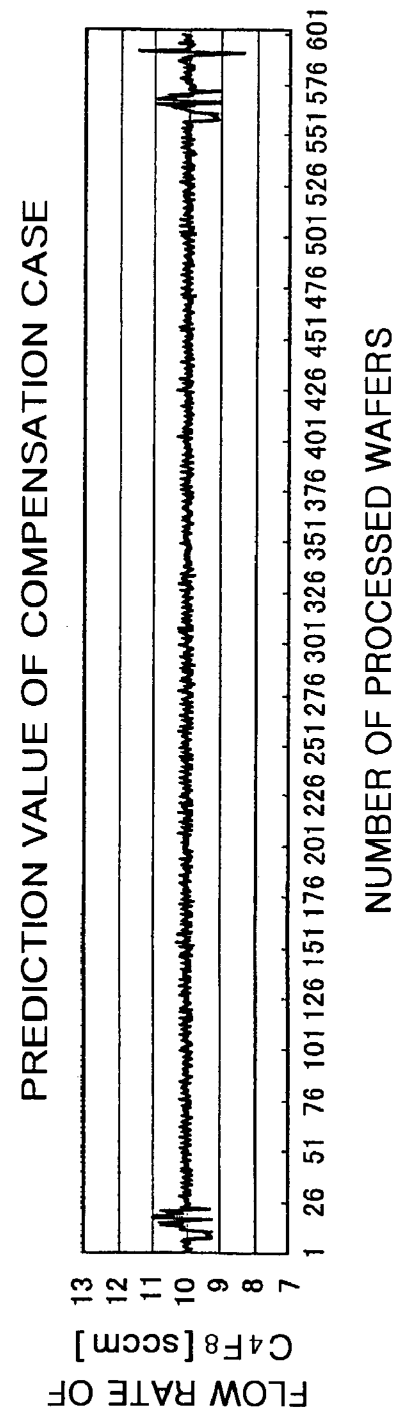

In FIGS. 18A and 19A, the prediction values are gradually increased and show a trend (gradient) increasing in a right-upper direction as a whole. That is, it can be understood that all the data of no compensation case show time dependent variation (aging errors). In contrast, all the data in FIGS. 18B and 19B show a trend (gradient) to be horizontal as a whole. As described above, by using data compensated with the EWMA processing, time dependent influence of the variation (aging error) on the prediction values can be eliminated.

As described above, in accordance with the third preferred embodiment, a model is constructed by the PLS method by using data compensated with the EWMA processing and the prediction values are calculated, so that influence of the time dependent variation in the detection values forming data of each parameter on the prediction values can be eliminated. Accordingly, accuracy of the prediction can be enhanced and information on the plasma processing can be accurately monitored all the time.

Further, by performing the multivariate analysis by the PLS method by using the parameters of the compensated detection values, even when performing a prediction for the control parameters or the apparatus status parameters and a process prediction for uniformity of an etching rate, pattern dimensions, etching patterns, damages and the like, the shift errors occurred between before and after, e.g., a maintenance and aging errors due to a long term operation of the processing apparatus can be eliminated, so that accuracy of the prediction can be enhanced.

Moreover, merely with a simple processing wherein the detection values are compensated, it is possible to prevent the change in trend of the detection values from affecting the results of the multivariate analysis, so that labor and time required to remake a model by the multivariate can be eliminated.

(Fourth Preferred Embodiment)

Hereinafter, a fourth preferred embodiment of the present invention will be described with reference to the drawings. Since configurations of a plasma processing apparatus and a multivariate analysis unit in accordance with the fourth preferred embodiment are identical to those shown in FIGS. 1 and 2, respectively, detailed descriptions thereon will be omitted.

The compensation unit 210 of the fourth preferred embodiment is included in a pre-processing unit for performing a compensation (pre-processing) for detection values currently detected by the respective detection devices based on previously detected values, as in the second preferred embodiment. The difference from the second embodiment is that the compensation is performed by a simpler operation. In other words, the compensation unit 210 of the fourth embodiment employs as the analysis data the compensated values obtained by subtracting the previous detection values from the current detection values detected by the detection devices.

(Principle of the Fourth Embodiment)

Principle of the fourth embodiment will now be described. Here, as the detection values of the detection devices serving as the analysis data, there are taken detection values, e.g., emission data S, for total wavelengths or wavelengths of a predetermined range of plasma obtained by the optical measurement device 120, e.g., a spectrometer. The emission data S are in general proportional to an apparatus function that is unique in the plasma processing apparatus to be inspected. Although the apparatus function may include various elements, it is assumed here that the apparatus function includes, e.g., elements represented in the following Eq. 25.

$$S=\{I_{org}\times L_{tool}\times(1+C_{str})\times\Delta\Omega\times T_{fib}\times T_{depo}+C_{back}\}\times\eta \qquad \text{Eq. 25}$$

In the above Eq. 25, $I_{org}\times L_{tool}\times(1+C_{str})$ is an apparatus system term, $\Delta\Omega$ is a stereoscopic angle term, $T_{fib}\times T_{depo}$ is a transmittance term, $C_{back}$ is a background light term, and $\eta$ is a CCD term. The apparatus system term $I_{org}\times L_{tool}\times(1+C_{str})$ is an element depending on an apparatus or system. $I_{org}$ is a value from an original plasma emission and therefore has a same value under a same processing condition. $L_{tool}$ is, e.g., a value based on variations depending on status of parts and is a term depending on the apparatus status. $C_{str}$ is a term depending on a stray light in the optical measurement device 120.

The stereoscopic angle term $\Delta\Omega$ is a term taking account of a plasma observing angle of an optical fiber receiving the plasma light and a light receiving amount based on inlet slits or inner slits of the optical measurement device 120, e.g., spectrometer. Among the transmittance term $T_{fib}\times T_{depo}$, $T_{fib}$ is a term based on a decrease in transmittance of the optical fiber, and $T_{depo}$ is a term based on foreign materials attached on an observation window provided in, e.g., a sidewall of the processing chamber. Since the decrease in transmittance of the optical fiber and the foreign materials attached on the observation window are main causes for the variation in transmittance of the plasma processing apparatus, the total transmittance of the plasma apparatus is represented by the two factors.

The background light term $C_{back}$ indicates a light (disturbance) from other than the plasma or a noise component such as dark current of CCD. The CCD term $\eta$ is an element based on a product of a quantum efficiency and a signal amplification efficiency of the CCD.

Herein, in the elements of the above Eq. 25, some may become a constant term, and therefore Eq. 25 can be simplified. $C_{str}$, $\Delta\Omega$, $C_{back}$ and $\eta$ are considered as constant terms. For example, as to $C_{str}$, it can be considered as a constant item for the reason that, since the optical measurement device 120 is fixed, the stray light is also constant if there is no misalignment in the optical system in the optical measurement device 120. As to $\Delta\Omega$, it can be considered as a constant item if there is no deviation in mounting the optical fiber. As to $C_{back}$, it is possible to make it constant since it can be assumed that the semiconductor processing apparatus is installed under an environment wherein the quantity of light is constant. As to $\eta$, it is also possible to have it constant since it can be assumed that the gain of the quantum efficiency and the amplification are always constant.

On the other hand, $I_{org}$, $L_{tool}$, $T_{fib}$ and $T_{depo}$ can be all considered as variables. For example, as to $I_{org}$, it can be considered as a variable since the emission quantity of the plasma itself depends on variations of the process parameters. Since $L_{tool}$ indicates variation due to the status of the parts, it can be considered as a function of time such as a temperature or degradation. Further, elements, which are not dependent on time, such as a mounting state of the part are not included in $L_{tool}$. The transmittance of the optical fiber is decreased as time passes, $T_{fib}$ can be handled as a variable. $T_{depo}$ is a variable depending on foreign materials attached on a surface of the observation window. Further, since it has been known that the variation of the transmittance due to the attachment of the foreign materials is decreased as an exponential function of time, $T_{depo}$ can be treated as a variable.

As explained above, if the elements that become a constant term are set as $K_1=\eta\times(1+C_{str})\times\Delta\Omega$ and $K_2=\eta\times(1+C_{back})$, Eq. 25 can be simplified as Eq. 26 below.

$$S=K_1\times I_{org}\times L_{tool}\times T_{fib}\times T_{depo}+K_2 \qquad \text{Eq. 26}$$

In Eq. 26, $I_{org}$ is a variable depending on the process parameters and $L_{tool}$ (t), $T_{fib}$ (t) and $T_{depo}$ (t) are variables relying on time. Accordingly, it is preferable that the time dependent variables $L_{tool}$ (t), $T_{fib}$ (t) and $T_{depo}$ (t) can be canceled by the pre-processing in accordance with the compensation process in the fourth embodiment.

If it is assumed that slight aging variations of the parts and the transmittance can be neglected over a very minute time period variation t+Δt, $L_{tool}$ (t+Δt), $T_{fib}$ (t+Δt) and $T_{depo}$ (t+Δt) can be treated as substantially equal to $L_{tool}$ (t), $T_{fib}$ (t) and $T_{depo}$ (t), respectively.

Hereinafter, by using the above Eq. 26, an actual verification for the compensation process of the fourth embodiment will be performed. In the compensation process of the fourth embodiment, for detection values such as the emission data S, last detection values are subtracted from current detection values and the resulted values are taken as the compensated detection values. Accordingly, a series of emission data are set as $S=\{s_1, s_2, \ldots, s_n\}$, and series are expressed by the following Eq. 27.

$$\begin{aligned} s_2' &= s_2 - s_1 \\ s_3' &= s_3 - s_2 \\ &\vdots \end{aligned} \qquad \text{Eq. 27}$$

In the above Eq. 27, if the emission data S are all normal in relation with the process parameters, Eq. 27 can be expressed by a general equation as the following Eq. 28.

$$s_n'=s_n-s_{n-1}=\{K_1I_{org}(p_1, p_2, \ldots, p_n)L_{tool}(t+\Delta t)T_{fib}(t+\Delta t)T_{depo}(t\times\Delta t)+K_2\}-\{K_1I_{org}(p_1, p_2, \ldots, p_n)L_{tool}(t)T_{fib}(t)T_{depo}(t)\times K_2\}\cong 0 \qquad \text{Eq.28}$$

As indicated in the above Eq. 28, if normal data are continued in relation with the process parameters, the compensated detection values subject to the compensation process of the fourth embodiment are standardized to about 0.

To the contrary, in case an abnormality occurs for a certain process parameter, e.g., $p_1$, Eq. 27 is expressed by the following Eq. 29.

$$s_n'=s_n-s_{n-1}=\{K_1I_{org}(p_1+\Delta p, p_2, \ldots, p_n)L_{tool}(t+\Delta t)T_{fib}(t+\Delta t)T_{depo}(t+\Delta t)+K_2\}-\{K_1I_{org}(p_1, p_2, \ldots, p_n)L_{tool}(t)T_{fib}(t)T_{depo}(t)+K_2\}\neq 0 \qquad \text{Eq. 29}$$

According to the above Eq. 29, since the compensated detection values do not come to be about 0 in case an abnormality occurs for a process parameter, e.g., $p_1$, they can be distinguished from other normal data. As such, in the compensation process of the fourth embodiment, aging errors of the time dependent variables such as $L_{tool}$ (t), $T_{fib}$ (t) and $T_{depo}$ (t) are eliminated and the abnormality can be determined when it occurs.

(Compensation Method of the Fourth Embodiment)

Figure 20:
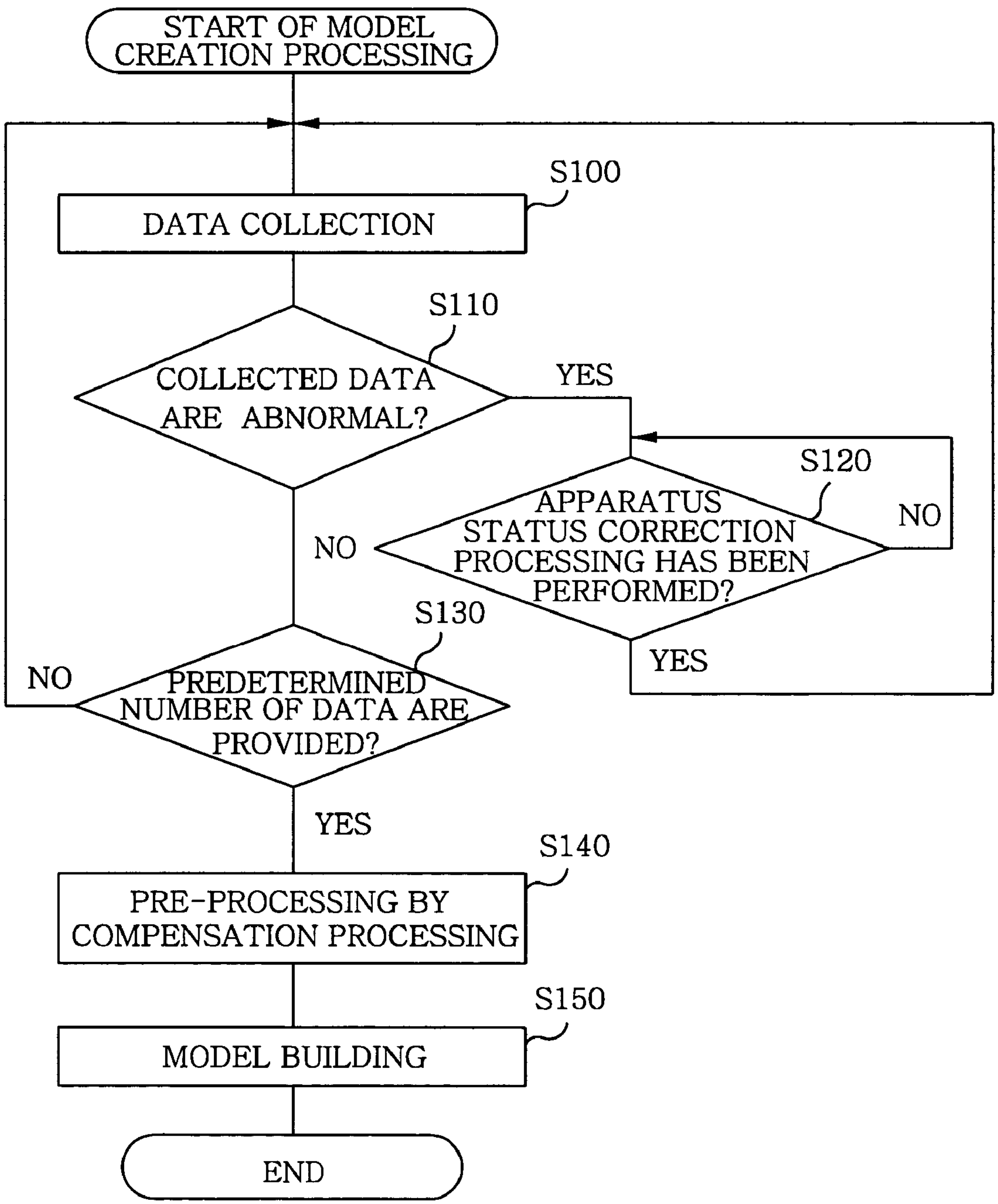
FIG. 20 sets forth a flowchart of a model creation process in accordance with a fourth preferred embodiment of the present invention.
Figure 21:
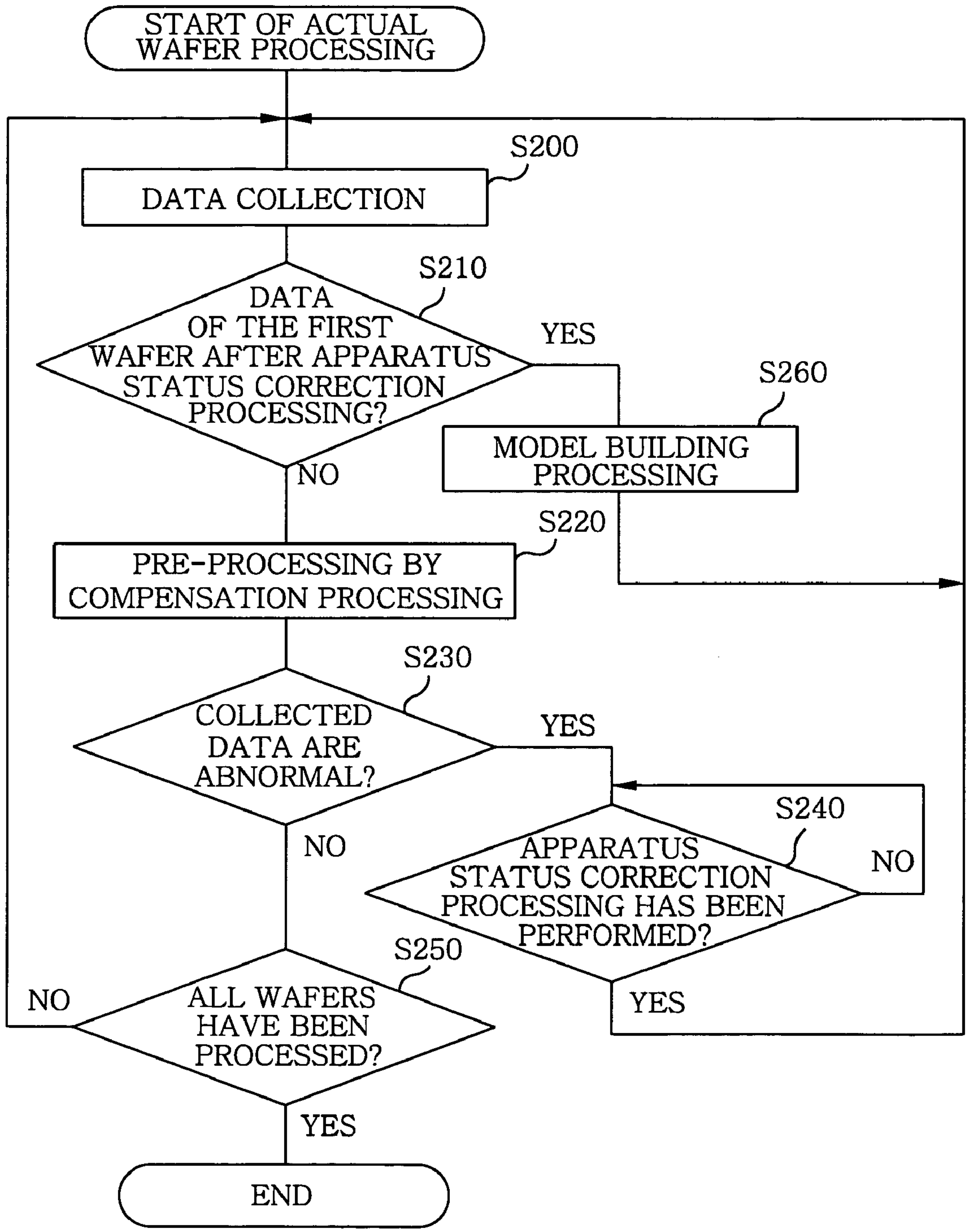
FIG. 21 describes a flowchart of an example of an actual wafer processing in the fourth preferred embodiment.

Hereinafter, a model building processing and an actual wafer processing by sing the compensation process of the fourth embodiment will be described based on the aforementioned principle. FIG. 20 is a flowchart of a model building processing for the multivariate analysis model shown in FIG. 2, and FIG. 21 is a flowchart of an actual wafer processing. Here, the multivariate analysis model is constructed by, e.g., the principal component analysis described above.

First, a model building processing is performed. A predetermined number of, e.g., 25, normal training data are obtained, and a multivariate analysis model is constructed by the principal component analysis for the training data.

Specifically, as shown in FIG. 20, data are collected at step S100. That is, e.g., one training wafer is plasma-processed by the plasma processing apparatus 100 to detect optical data (e.g., optical data of plasma emission intensity in a full wavelength area obtained by a spectrometer). Although, at step S100, the plasma processing is performed for each training wafer, the plasma processing may be performed for each lot including a plurality of training wafers to obtain emission data for each lot. Further, at step S100, besides the optical data, processing result data such as an etching rate and in-surface uniformity and apparatus status data such as analysis result by the PLS method may be collected, which are used in determining abnormality at step S110 to be described below.

Next, at step S110, it is determined whether or not the optical data collected can be employed as data used in a model creation processing to be described later. Here, it is determined whether or not, besides the optical data, data such as the etching rate and the in-surface uniformity collected are abnormal. For example, if the etching rate is normal, the optical data at that time are considered as data that can be used in the model building; but if the etching rate is abnormal, the optical data at that time are considered as data that cannot be used in the model building. Hereinafter, the optical data at that time when the processing result data and the apparatus status data are normal are expressed as "normal optical data", and the optical data at that time when the processing result data and the apparatus status data are abnormal are expressed as "abnormal optical data".

The etching rate is obtained from, e.g., the beginning and ending time of the etching and the measurement result for film thickness of the wafer after the plasma processing. Further, the in-surface uniformity is obtained from, e.g., the results of measuring under pressure several points of samples on the wafer after the plasma processing. In addition, the determination on whether the optical data collected are abnormal or normal may be performed based on the model previously built by the PLS method. In this case, when emission data for one lot are measured as described above, training wafers that were determined to be abnormal among those of the lot may be further plasma-processed and determined.

In case the optical data collected are determined to be abnormal at the step S110, it is determined whether or not the status of the plasma processing apparatus 100 has been corrected at step S120 and if yes, the process returns to the step S100. Specifically, in case the optical data collected are determined to be abnormal at the step S110, for example, there is provided an alarm or a display indicating that the plasma processing apparatus 100 needs to be stopped for maintenance thereof. Then, at the step S120, for example, it is determined whether or not the plasma processing apparatus 100 works again. In case it is determined that the plasma processing apparatus 100 is operated again, it is determined that the status of the apparatus has been corrected.

Furthermore, the correction is performed in accordance with the kind of abnormality. For example, in case the etching rate is abnormal, it is due to differences in the process conditions (etching conditions) and status change of the processing chamber (e.g., states of attachments and change in impedance in the processing chamber due to a part such as an upper electrode). For example, if the abnormality of the emission data is due to the differences in the process condition (etching conditions), as the correction processing, the process conditions (etching conditions) are made correct, and if the abnormality of the emission data is due to the foreign material attached inside the processing chamber, as the correction processing, the inside of the processing chamber is cleaned. If the abnormality of the emission data is due to the change in impedance due to the part in the processing chamber, as the correction processing, the part is replaced. Further, if the abnormality of the emission data is based on the in-surface uniformity of the wafer, as the correction processing, the wafer in question is removed from the training data. In addition, in case the correction processing of the apparatus status itself is a maintenance performed automatically, performance of the apparatus status correction processing may substitute for the determination on whether or not the apparatus status has been corrected at the step S120.

In case it is determined at the step S110 that there is no abnormality in the emission data, i.e., the latter are normal, it is determined at step S130 whether or not emission data for a predetermined number of, e.g., 25 wafers are prepared and if yes, a pre-processing is performed at step 140 as a compensation processing by the compensation unit 210 of the fourth preferred embodiment for the emission data. Specifically, as expressed in the above Eq. 28, with respect to the emission data, by subtracting current detection value from last detection value for each emission data of the wafer and taking the result as the compensated detection value, the detection values are compensated in sequence. Further, in this case, for example, the initial emission data of the wafer have no last emission data, so that they may not be used as the training data. Moreover, as the compensation processing at the step S140, the compensation processing of the first to the third preferred embodiments may be employed.

Subsequently, at step S150, the multivariate analysis by the principal component analysis is performed through the analysis unit 212 by using as the training data the emission data subject to the pre-processing and a multivariate analysis model is constructed.

According to the model building processing described above, 25 training wafers are first plasma-processed by the plasma processing apparatus 100 and optical data, e.g., data of plasma emission intensity of a predetermined wavelength are detected. It is determined whether or not the data are abnormal and if yes, the emission data are corrected by performing maintenance of the plasma processing apparatus 100. After obtaining all normal training data, a multivariate analysis model is built based on the training data. In this way, the multivariate analysis model can be constructed by using the normal training data, so that the accuracy of abnormality detection can be prevented from being degraded due to emission data used in constructing the multivariate analysis model.

Hereinafter, a processing for actual wafers as shown in FIG. 21 is performed. A predetermined number of, e.g., 25, normal training data are obtained, and a multivariate analysis model is constructed by the principal component analysis for the training data.

Specifically, data are collected at step S200. That is, e.g., one actual wafer (test wafer) is plasma-processed by the plasma processing apparatus 100 to detect optical data (e.g., optical data of plasma emission intensity in a full wavelength area obtained by a spectrometer). As similarly to the step S100, the step S200 is not limited to the plasma processing being performed for each training wafer, the plasma processing may be performed for each lot including a plurality of training wafers to obtain emission data for each lot.

Further, at step S210, it is determined whether or not the emission data collected are the emission data of the first wafer after the apparatus status correction processing has been performed. Such determination step is required for the following reasons. For example, in case the pre-processing by the compensation processing of the fourth embodiment (the processing of taking as the compensated detection values the values obtained by subtracting last detection value from current detection value) is performed, if the emission data of the first wafer after the apparatus status correction processing are taken as the current detection value, last detection value correspond to abnormal data. Therefore, in case of subtracting the abnormal data from the current detection values, if the current detection values are normal, there is a possibility that the current detection values may be determined as abnormal even when they are normal since the compensated detection values become greater. Further, contrary to the above, if the current detection values are abnormal, there is a possibility that the current detection values may be determined as normal even when they are abnormal since the compensated detection values become substantially about 0.

Next, in case it is determined at the step S210 that the emission data collected are the emission data of the first wafer after the apparatus status correction processing, the model building processing of the multivariate model is performed at step S260. The model building processing in this case is identical to that shown in FIG. 20. For example, the model building processing in FIG. 20 is performed by using as the first training wafer the first wafer after the apparatus status correction processing has been performed. Then, the multivariate analysis model is reconstructed, and the process returns to the step S200 to begin the processing of an actual wafer.

As described above, since the multivariate analysis model is reconstructed in case it is determined that the collected emission data are emission data of the first wafer after the apparatus status collection processing, there is no case that last data are abnormal data in the pre-processing by the compensation processing of the fourth preferred embodiment. Accordingly, it is possible to remove the likelihood of erroneously determining whether or not emission data of each wafer including the first wafer after the apparatus status correction processing are abnormal.

In case it is determined at the step S210 that the emission data collected are not the emission data of the first wafer after the apparatus status correction processing, at step S220, the pre-processing of the fourth embodiment is performed. That is, in the pre-processing in this case, the current detection value is the emission data collected by plasma-processing the actual wafer, and the compensated detection value is a value obtained by subtracting last detection value from the current detection value. Further, as the compensating processing at step S220, the compensation processing of the first and the third embodiment may be employed.

Subsequently, at step S230, it is determined whether or not the emission data collected are abnormal. Specifically, it is determined whether or not the emission data collected are abnormal based on the multivariate model constructed by the model building processing shown in FIG. 20. For example, after a residual score Q of the emission data collected is calculated based on the multivariate analysis model, it is determined normal if the residual score Q falls within a predetermined range, but abnormal if otherwise.

In case it is determined at the step S230 that the emission data collected are abnormal, it is determined at step S240 whether or not the apparatus status correction processing has been performed. The processing at the step S240 is the same as that at the step 120 in FIG. 20.

On the other hand, in case it is determined at the step S230 that the emission data collected are normal, it is determined at step S250 whether or not all wafers have been processed. At the step S250, if it is determined that all wafers have not yet been processed, the process returns to the step S200, but if it is determined that all wafers have been processed, the processing of the actual wafers is completed.

Figure 22:
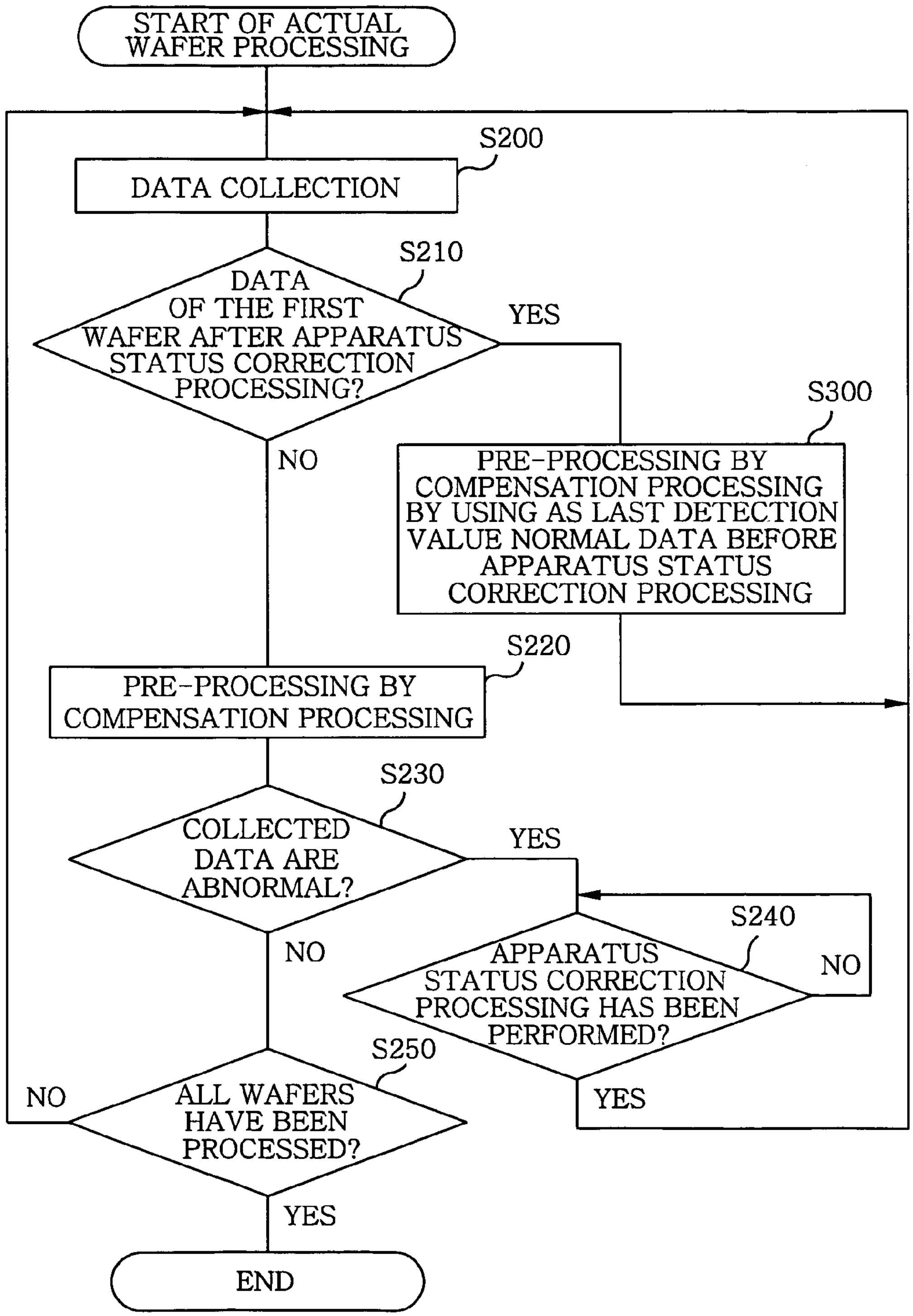
FIG. 22 provides a flowchart of another example of the actual wafer processing in the fourth preferred embodiment.

Hereinafter, there will be described with reference to the drawings a case wherein the processing of the actual wafers explained by using FIG. 21 is performed by another method. FIG. 22 is a flowchart showing the processing of the actual wafers by another method. In FIG. 22, the processes of steps S200 to S250 are the same as those in FIG. 21, and detailed descriptions thereof will, therefore, be omitted.

The processing of the actual wafers by another method has a different process in case it is determined that the emission data collected are emission data of the first wafer after the apparatus status correction processing has been performed. That is, in the processing shown in FIG. 22, at step S300, normal emission data before the apparatus status correction processing are taken as last detection values and the pre-processing by the compensation processing of the fourth embodiment is performed. For example, as to normal emission data before the apparatus status correction processing, if data immediately before abnormal emission data are normal emission data, the normal emission data are taken as last detection value and a value obtained by subtracting last detection value from current detection value is taken as the compensated detection value.

In this way, for the emission data of the first wafer after the apparatus status correction processing has been performed, even though the data immediately before them are abnormal data, since, without using the data, the pre-processing is performed by taking as the last detection values normal emission data before the apparatus status correction processing, the compensated detection values become normal values. By this, as similarly to the processing case in FIG. 21, it is possible to remove the apprehension of erroneously determining whether or not emission data of each wafer including the emission data of the first wafer after the apparatus status correction processing are abnormal. Further, it is not necessary to reconstruct the multivariate analysis model at the step S260 as in the processing of FIG. 21 and it is sufficient to simply take the normal data as the last detection values. Accordingly, the processing time can be shortened and the operation burden can also be reduced.

Hereinafter, there will be reviewed results of an experiment wherein the principal component analysis by using data compensated by the method described above with the compensation unit 210 of the fourth embodiment. The principal component analysis was carried out based on detection values from the detection devices for each wafer in case an etching process is performed on a silicon film on the wafer as the plasma processing.

Figure 23:
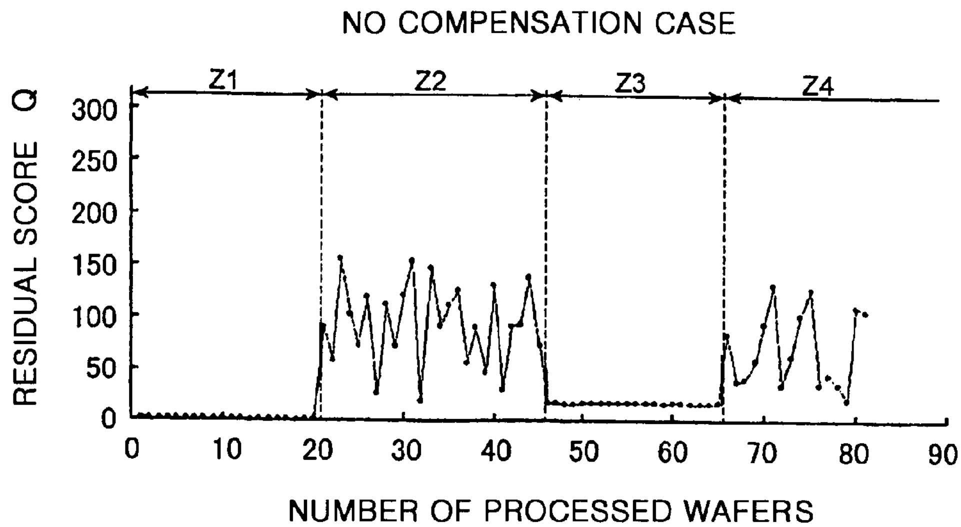
FIG. 23 represents a graph showing residual scores Q in a case where a principal component analysis is performed by using detection values subject to no compensation to create a model, in the fourth preferred embodiment.
Figure 24:
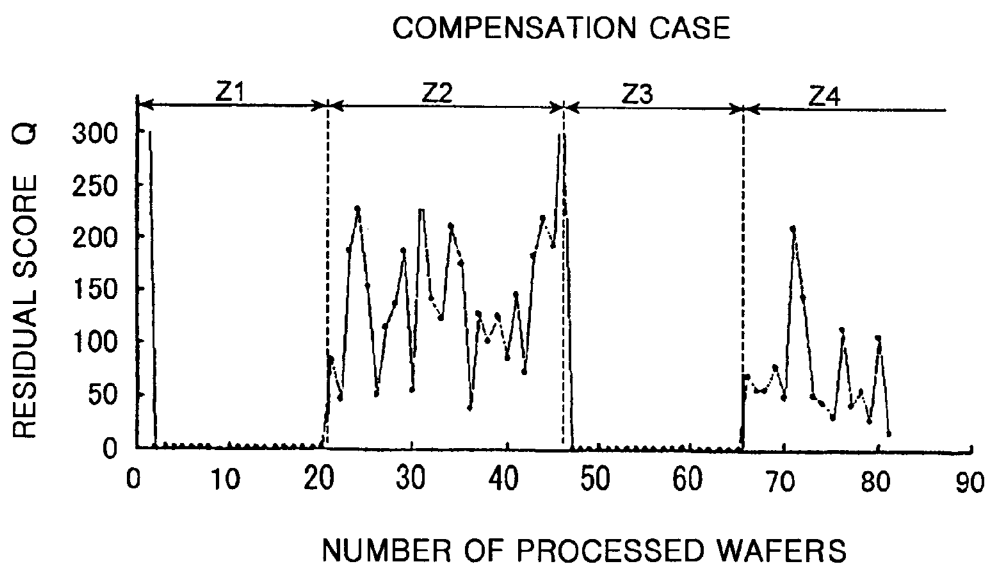
FIG. 24 provides a graph showing residual scores Q in a case where a principal component analysis is performed by using detection values subject to compensation to create a model, in the fourth preferred embodiment.

First, an example wherein the shift errors have been eliminated will be described with reference to FIGS. 23 and 24. FIG. 24 shows results of residual scores (sum of residual squares) obtained by performing the principal component analysis by using detection values subject to the compensation of the fourth preferred embodiment. FIG. 23 indicates results of residual scores (sum of residual squares) obtained by performing the principal component analysis by using detection values subject to no compensation of the fourth preferred embodiment for comparison with the result of FIG. 24. Here, by using the plasma processing apparatus 100, the experiment was performed, e.g., under the following standard etching conditions. That is, as the etching conditions, a high frequency power applied to the lower electrode was 3000 W and its frequency was 13.56 MHz; a pressure in the processing chamber 101 was 40 mTorr; and a gaseous mixture of $C_4F_8$ of 26 sccm, $O_2$ of 19 sccm, CO of 100 sccm, and Ar of 1000 sccm was used as a processing gas. Moreover, a multivariate analysis model was constructed by performing the principal component analysis with use of initial 25 wafers as training wafers. Further, from the $26^{th}$ wafer, wafers were taken as test wafers and a determination on whether detection values of the test wafers are abnormal or normal was carried out based on the multivariate analysis model.

In FIG. 23, sections Z1 and Z3 are normal cases wherein the etching was performed under the standard etching conditions. As can be seen from FIG. 23, shift errors occur in the sections Z1 and Z3. This is because in the sections Z1 and Z3, the etching process was performed on different days. As such, in case the etching processes were performed on different days, the shift errors occur as those between before and after the maintenance described above. Further, in sections Z2 and Z4, there occurred abnormalities by changing the standard etching conditions.

As can be seen from FIG. 24, in the sections Z1 and Z3, the residual scores Q are all changed to be close to 0, so that both of the sections Z1 and Z3 can be determined to be normal data. Moreover, in the sections Z2 and Z4 in FIG. 24, the residual scores Q are also greatly changed, so that the sections Z2 and Z4 can be determined to be abnormal data. As described above, by performing the compensation processing of the fourth embodiment, the shift errors can be eliminated and the determination on normality or abnormality can be accurately performed.

Figure 25:
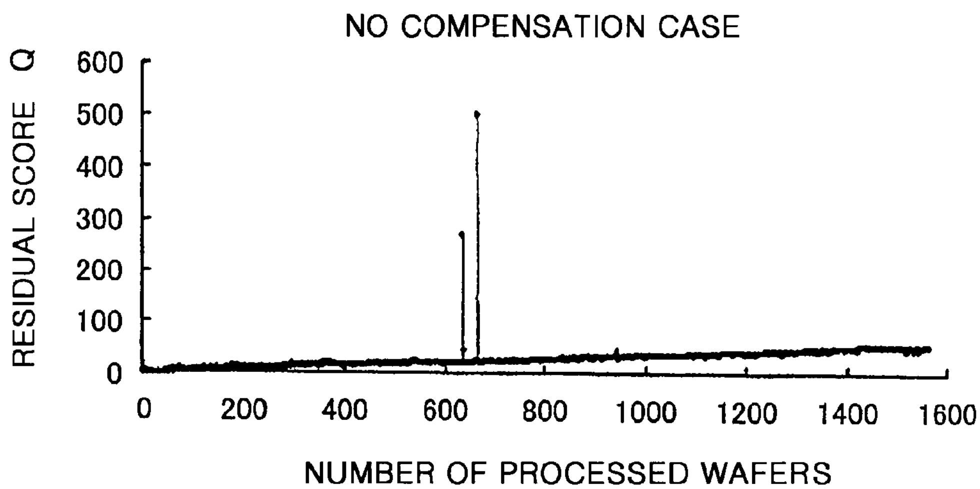
FIG. 25 is a graph showing residual scores Q in a case where a principal component analysis is performed by using detection values subject to no compensation to create a model, in the fourth preferred embodiment.
Figure 26:
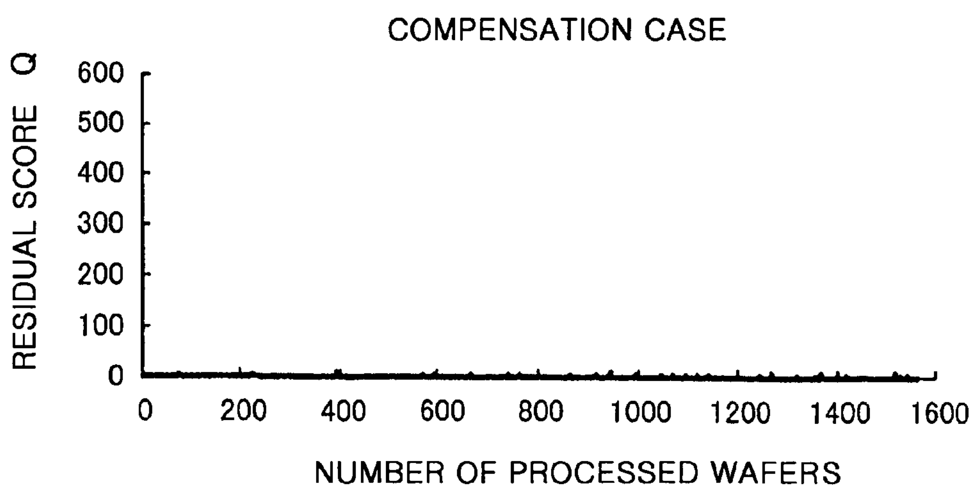
FIG. 26 depicts a graph showing residual scores Q in a case where a principal component analysis is performed by using detection values subject to compensation to create a model, in the fourth preferred embodiment.

Further, an example wherein the aging errors have been eliminated will be described with reference to FIGS. 25 and 26. FIG. 26 shows results of residual scores (sum of residual squares) obtained by performing the principal component analysis by using detection values subject to compensation of the fourth preferred embodiment. FIG. 25 indicates results of residual scores (sum of residual square) Q obtained by performing the principal component analysis by using detection values subject to no compensation of the fourth preferred embodiment for the comparison with the result of FIG. 26. Herein, a plasma processing apparatus of a type, different from the plasma processing apparatus 100, wherein the high frequency power is applied to both the lower electrode and the upper electrode, was used. The high frequency power applied to the upper electrode has, e.g., a frequency of 60 MHz, and the high frequency power applied to the lower electrode has, e.g., a frequency of 13.56 MHz.

By using such a plasma processing apparatus, the experiment was performed, e.g., under the following standard etching conditions. That is, as the etching conditions, the high frequency power applied to the upper electrode was 3300 W and the high frequency power applied to the lower electrode was 3800 W; a pressure in the processing chamber was 25 mTorr; and a gaseous mixture of $C_5F_8$ of 29 sccm, $O_2$ of 47 sccm, and Ar of 750 sccm was used as a processing gas. Moreover, a multivariate analysis model was constructed by performing the principal component analysis with use of initial 25 wafers as training wafers. Further, from the $26^{th}$ wafer, wafers were taken as test wafers and a determination on normality or abnormality was carried out based on the multivariate analysis model.

In FIG. 25, there occur aging errors wherein the residual scores Q are gradually increased. Further, there are great residual scores Q in a section where the number of wafers processed is in a range of 600~700. These are portions where the residual scores indicate abnormality notwithstanding they are normal.

As can be seen from FIG. 26, the residual scores Q are changed to be close to about 0 therethroughout, so that they can be determined to be normal data therethroughout. Moreover, in FIG. 26, for the portions where the great residual scores occur in the section of 600~700 processed wafers shown in FIG. 25, the residual scores Q becomes to be close about 0. These portions are actually normal, so that this is reflected on the residual scores Q. As such, by performing the compensation processing of the fourth embodiment, the aging errors as well as the aforementioned shift errors can be eliminated, and the determination on normality or abnormality can be accurately carried out.

Although, in the fourth embodiment, there has been described the case wherein the principal component analysis is performed as the multivariate analysis by using the detection values subject to the above compensation processing, the present invention is not limited thereto. A multiple regression analysis such as the PLS method may be performed by using the compensated detection values.

While the invention has been shown and described with respect to the preferred embodiments with reference to the accompanying drawings, it will be understood by those skilled in the art that various changes and modifications may be made without departing from the spirit and scope of the invention as defined in the claims.

For instance, the plasma processing apparatus is not limited to a parallel plate plasma etching apparatus, but the present invention may be applied, e.g., to a helicon wave plasma etching apparatus and an inductively coupled plasma etching apparatus which generate plasma in a processing chamber. Furthermore, although the preferred embodiments describe the plasma processing apparatus adopting the dipole ring magnet, the present invention is not necessarily limited thereto. In other words, the plasma processing apparatus may generate plasma by applying a high frequency power to an upper and a lower electrode without using the dipole ring magnet, for example.

In accordance with the present invention, even though the trend of the detection values is changed due to the variation in status of the processing apparatus, the accuracy of abnormality detection of the apparatus and status prediction of the apparatus or the objects to be processed can be increased, and information on the plasma processing can be accurately monitored.

What is claimed is:

1. A plasma processing method for monitoring information on a plasma processing in a processing apparatus which generate plasma in an air-tight processing chamber to plasma-process objects to be processed, the plasma processing method comprising:

a data collecting step of collecting detection values detected for each of the objects from a plurality of detection devices disposed in the processing apparatus upon the plasma processing;

a compensating step of compensating the detection values from the detection devices in respective sections that are defined whenever a maintenance of the processing apparatus is performed; and an analysis processing step of performing a multivariate analysis by using as analysis data the compensated detection values and monitoring information on the plasma processing based on the analysis results.

2. The plasma processing method of claim 1, wherein at the compensating step, the detection values in the respective sections are compensated by calculating an average of the detection values in a range among those in the respective sections and subtracting the average from the detection values in the respective sections.

3. The plasma processing method of claim 1, wherein at the compensating step, the detection values in the respective sections are compensated by calculating an average of the detection values in a range among those in the respective sections and dividing the detection values in the respective sections by the average.

4. The plasma processing method of claim 1, wherein at the compensating step, the detection values in the respective sections are compensated by calculating an average of all the detection values in the respective sections and subtracting the average from the detection values in the respective sections.

5. The plasma processing method of claim 1, wherein at the compensating step, the detection values in the respective sections are compensated in a way that an average and a standard deviation of the detection values in the respective sections are calculated and values obtained by subtracting the average from the detection values in the respective sections are divided by the standard deviation.

6. The plasma processing method of claim 1, wherein at the compensating step, the detection values in the respective sections are compensated in a way that an average and a standard deviation of the detection values in the respective sections are calculated, values obtained by subtracting the average from the detection values in the respective sections are divided by the standard deviation, and a loading compensation is performed for the resulted values.

7. The plasma processing method of claim 1, wherein a principal component analysis is performed as the multivariate analysis to detect a status abnormality of the processing apparatus based on the result thereof.

8. The plasma processing method of claim 1, wherein a multiple regression analysis is performed as the multivariate analysis to construct a model, and a status prediction of the processing apparatus or a status prediction of the objects is performed by using the model.

9. A plasma processing apparatus for monitoring information on a plasma processing while generating plasma in an air-tight processing chamber to plasma-process objects to be processed, the plasma processing apparatus comprising:

a data collection unit for collecting detection values detected for each of the objects from a plurality of detection devices disposed in the processing apparatus upon the plasma processing;

a compensation unit for compensating the detection values from the detection devices in respective sections that are defined whenever a maintenance of the processing apparatus is performed; and an analysis processing unit for performing a multivariate analysis by using as analysis data the compensated detection values and monitoring information on the plasma processing based on the analysis results.

10. The plasma processing apparatus of claim 9, wherein the compensation unit compensates the detection values in the respective sections by calculating an average of the detection values in a range among those in the respective sections and subtracting the average from the detection values in the respective sections.

11. The plasma processing apparatus of claim 9, wherein the compensation unit compensates the detection values in the respective sections by calculating an average of the detection values in a range among those in the respective sections and dividing the detection values in the respective sections by the average.

12. The plasma processing apparatus of claim 9, wherein the compensation unit compensates the detection values in the respective sections by calculating an average of all the detection values in the respective sections and subtracting the average from the detection values in the respective sections.

13. The plasma processing apparatus of claim 9, wherein the compensation unit compensates the detection values in the respective sections in a way that an average and a standard deviation of the detection values in the respective sections are calculated and values obtained by subtracting the average from the detection values in the respective sections are divided by the standard deviation.

14. The plasma processing apparatus of claim 9, wherein the compensation unit compensates the detection values in the respective sections in a way that an average and a standard deviation of the detection values in the respective sections are calculated, values obtained by subtracting the average from the detection values in the respective sections are divided by the standard deviation, and a loading compensation is performed for the resulted values.

15. The plasma processing apparatus of claim 9, wherein a principal component analysis is performed as the multivariate analysis to detect a status abnormality of the processing apparatus based on the result thereof.

16. The plasma processing apparatus of claim 9, wherein a multiple regression analysis is performed as the multivariate analysis to construct a model, and a status prediction of the processing apparatus or a status prediction of the objects is performed by using the model.

17. A plasma processing method for monitoring information on a plasma processing in a processing apparatus which generates plasma in an air-tight processing chamber to plasma-process objects to be processed, the plasma processing method comprising:

a data collecting step of collecting detection values detected in a sequence of time for each of the objects from a plurality of detection devices disposed in the processing apparatus upon the plasma processing;

a compensating step of sequentially compensating the detection values detected by the detection devices in a way that a current prediction value for the detection value detected by the detection devices is obtained by averaging a weighted last prediction value and a weighted current or last detection value, and a value obtained by subtracting the current prediction value from the current detection value is taken as a detection value after the compensation; and an analysis processing step of performing a multivariate analysis by using as analysis data the compensated detection values and monitoring information on the plasma processing based on the analysis results.

18. The plasma processing method of claim 17, wherein the analysis processing step includes:

a model building step of constructing a model by performing a principal component analysis as the multivariate analysis by using data in a section among the compensated detection values as the analysis data; and an abnormality detecting step of detecting abnormality or normality of the status of the processing apparatus by using data in another section among the compensated detection values taken as the analysis data, based on the model.

19. The plasma processing method of claim 17, wherein the analysis processing step includes:

a model building step of constructing a model by dividing the analysis data into an explanatory variable and an objective variable and performing a partial least squares method as the multivariate analysis data by using data in a section among the divided analysis data to construct a model; and a prediction step of predicting data of the objective variable by using data of the explanatory variable in another section among the analysis data based on the model, wherein analysis data including the compensated detection values at the compensating step are used for the data of at least the explanatory variable between the explanatory variable and the objective variable.

20. The plasma processing method of claim 19, wherein as the objective variable, data of the status of the processing apparatus or the status of the objects among the analysis data are used.

21. A plasma processing apparatus for monitoring information on a plasma processing while generating plasma in an air-tight processing chamber to plasma-process objects to be processed, the plasma processing apparatus comprising:

a data collection unit for collecting detection values detected in a sequence of time for each of the objects from a plurality of detection devices disposed in the processing apparatus upon the plasma processing;

a compensation unit for sequentially compensating the detection values detected by the detection devices in a way that a current prediction value for the detection value detected by the detection devices is obtained by averaging a weighted last prediction value and a weighted current or last detection value, and a value obtained by subtracting the current prediction value from the current detection value is taken as the compensated detection value; and an analysis processing unit for performing a multivariate analysis by using as analysis data the compensated detection values and monitoring information on the plasma processing based on the analysis results.

22. The plasma processing apparatus of claim 21, wherein the analysis processing unit includes:

a model building unit for constructing a model by performing a principal component analysis as the multivariate analysis by using data in a section among the compensated detection values as the analysis data; and an abnormality detecting unit for detecting abnormality or normality of the status of the processing apparatus by using data in another section among the compensated detection values taken as the analysis data, based on the model.

23. The plasma processing apparatus of claim 21, wherein the analysis processing unit includes:

a model building unit for constructing a model by dividing the analysis data into an explanatory variable and an objective variable and performing a partial least squares method as the multivariate analysis by using data in a section among the divided analysis data to construct a model; and a prediction unit for predicting data of the objective variable by using data of the explanatory variable in another section among the analysis data based on the model, wherein analysis data including the compensated detection values by the compensation unit are used for the data of at least the explanatory variable between the explanatory variable and the objective variable.

24. The plasma processing method of claim 23, wherein as the objective variable, data of the status of the processing apparatus or the status of the objects among the analysis data are used.

25. A plasma processing method for monitoring information on a plasma processing in a processing apparatus which generates plasma in an air-tight processing chamber to plasma-process objects to be processed, the plasma processing method comprising:

a data collecting step of collecting detection values detected in a sequence of time for each of the objects from a plurality of detection devices disposed in the processing apparatus upon the plasma processing;

a compensating step of sequentially compensating the detection values detected by the detection devices in a way that a value obtained by subtracting a current detection value detected by the detection devices from a last detection value is used as a compensated detection value; and an analysis processing step of performing a multivariate analysis by using as analysis data the compensated detection values and monitoring information on the plasma processing based on the analysis results.

26. The plasma processing method of claim 25, wherein the analysis processing step includes:

a model building step of constructing a model by performing a principal component analysis as the multivariate analysis by using as the analysis data the compensated detection values for some of the objects to be processed;

an abnormality detecting step of detecting abnormality or normality of the status of the processing apparatus by using the compensated detection values for other objects to be processed based on the model; and an apparatus status correction step of accelerating an apparatus status correction processing of the processing apparatus if abnormality is detected, and performing again the plasma processing after the apparatus status correction processing has been completed.

27. The plasma processing method of claim 26, wherein analysis data used at the model building step are all data when the apparatus status is normal.

28. The plasma processing method of claim 26, wherein at the compensation step, it is determined whether or not an obtained detection value is one after the apparatus status correction processing, and there is performed a compensation wherein a value obtained by subtracting a current detection value from a last detection value is taken as the compensated detection value if it is determined that the obtained detection value is not one after the apparatus status correction processing, while the model is reconstructed by the model building step if it is determined that the obtained detection value is one after the apparatus status correction processing.

29. The plasma processing method of claim 26, wherein at the compensation step, it is determined whether or not an obtained detection value is one after the apparatus status correction processing, and there is performed a compensation wherein a value obtained by subtracting a current detection value from a last detection value is taken as the compensated detection value if it is determined that the obtained detection value is not one after the apparatus status correction processing, while there is performed a compensation wherein a detection value at that time when the apparatus status is normal before the apparatus status correction processing is taken as a last detection value and a value obtained by subtracting a current detection value from said last detection value if it is determined that the obtained detection value is one after the apparatus status correction processing.

30. A plasma processing apparatus for monitoring information on a plasma processing while generating plasma in an air-tight processing chamber to plasma-process objects to be processed, the plasma processing apparatus comprising:

a data collection unit for collecting detection values detected in a sequence of time for each of the objects from a plurality of detection devices disposed in the processing apparatus upon the plasma processing;

a compensation unit for sequentially compensating detection values detected by the detection devices in a way that a value obtained by subtracting a current detection value detected by the detection devices from a last detection value is used as a compensated detection value; and an analysis processing unit for performing a multivariate analysis by using as analysis data the compensated detection values and monitoring information on the plasma processing based on the analysis results.

31. The plasma processing apparatus of claim 30, wherein the analysis processing unit includes:

a model building unit for constructing a model by performing a principal component analysis as the multivariate analysis by using as the analysis data the compensated detection values for a predetermined number of the objects to be processed;

an abnormality detection unit for detecting abnormality or normality of the status of the processing apparatus by the compensated detection values for other objects to be processed based on the model; and an apparatus status correction unit for accelerating an apparatus status correction processing of the processing apparatus if abnormality is detected, and performing again the plasma processing after the apparatus status correction processing has been completed.

32. The plasma processing apparatus of claim 31, wherein analysis data used in the model building unit are all data when the apparatus status is normal.

33. The plasma processing apparatus of claim 31, wherein the compensation unit determines whether or not an obtained detection value is one after the apparatus status correction processing, performs a compensation wherein a value obtained by subtracting a current detection value from a last detection value is taken as the compensated detection value if it is determined that the obtained detection value is not one after the apparatus status correction processing, and reconstructs the model by the model building unit if it is determined that the obtained detection value is one after the apparatus status correction processing.

34. The plasma processing method of claim 31, wherein the compensation unit determines whether or not an obtained detection value is one after the apparatus status correction processing, performs a compensation wherein a value obtained by subtracting a current detection value from a last detection value is taken as the compensated detection value if it is determined that the obtained detection value is not one after the apparatus status correction processing, and performs a compensation wherein a detection value at a time when the apparatus status is normal before the apparatus status correction processing is taken as a last detection value and a value obtained by subtracting a current detection value from said last detection value if it is determined that the obtained detection value is one after the apparatus status correction processing.

* * * * *